(12) United States Patent
Cochran et al.

(10) Patent No.: US 11,072,094 B2
(45) Date of Patent: *Jul. 27, 2021

(54) METHOD AND SYSTEM FOR WAVELENGTH SPECIFIC THERMAL IRRADIATION AND TREATMENT

(75) Inventors: Don W. Cochran, Novelty, OH (US); Steven D. Cech, Aurora, OH (US); Noel Edward Morgan, North Olmsted, OH (US)

(73) Assignee: PRESSCO IP LLC, Cleveland, OH (US)

( * ) Notice: Subject to any disclaimer, the term of this patent is extended or adjusted under 35 U.S.C. 154(b) by 512 days.

This patent is subject to a terminal disclaimer.

(21) Appl. No.: 11/351,030

(22) Filed: Feb. 9, 2006

(65) Prior Publication Data

US 2006/0280825 A1 Dec. 14, 2006

Related U.S. Application Data

(63) Continuation of application No. 11/003,679, filed on Dec. 3, 2004.

(51) Int. Cl.
*B29C 49/68* (2006.01)
*B29B 13/02* (2006.01)
(Continued)

(52) U.S. Cl.
CPC .......... *B29B 13/023* (2013.01); *A23L 3/005* (2013.01); *A23L 3/26* (2013.01); *A23L 5/15* (2016.08);
(Continued)

(58) Field of Classification Search
CPC .............. B29B 13/023; B29B 13/024; B29B 2911/1402; B29B 2911/14026;
(Continued)

(56) References Cited

U.S. PATENT DOCUMENTS

| | | | |
|---|---|---|---|
| 2,145,196 | A | 11/1933 | Biggs |
| 2,864,932 | A | 12/1958 | Forrer |

(Continued)

FOREIGN PATENT DOCUMENTS

| | | |
|---|---|---|
| AU | 2014 202 581 A1 | 6/2014 |
| CN | 85101777 A | 1/1987 |

(Continued)

OTHER PUBLICATIONS

"Thin-Disk Lasers Position Themselves in Industry," R&D Magazine, Apr. 2005.

(Continued)

*Primary Examiner* — Robert B Davis
(74) *Attorney, Agent, or Firm* — Fay Sharpe LLP

(57) ABSTRACT

A system for direct injection of selected thermal-infrared (IR) wavelength radiation or energy into articles for a wide range of processing purposes is provided. These purposes may include heating, raising or maintaining the temperature of articles, or stimulating a target item in a range of different industrial, medical, consumer, or commercial circumstances. The system is especially applicable to operations that require or benefit from the ability to irradiate at specifically selected wavelengths or to pulse or inject the radiation. The system is particularly advantageous when functioning at higher speeds and in a non-contact environment with the target.

59 Claims, 12 Drawing Sheets

(51) Int. Cl.
   *A23L 5/10* (2016.01)
   *A23L 5/30* (2016.01)
   *A23L 3/005* (2006.01)
   *A23L 3/26* (2006.01)
   *B29C 49/64* (2006.01)
   *B29C 49/78* (2006.01)
   *H05B 3/00* (2006.01)
   *B29C 35/08* (2006.01)
   *B29C 49/06* (2006.01)

(52) U.S. Cl.
   CPC .............. *A23L 5/36* (2016.08); *B29B 13/024* (2013.01); *B29C 49/64* (2013.01); *B29C 49/68* (2013.01); *B29C 49/78* (2013.01); *H05B 3/0057* (2013.01); *B29B 2911/1402* (2013.01); *B29B 2911/1404* (2013.01); *B29B 2911/14026* (2013.01); *B29B 2911/14033* (2013.01); *B29B 2911/14106* (2013.01); *B29B 2911/14133* (2013.01); *B29B 2911/14213* (2013.01); *B29C 35/08* (2013.01); *B29C 49/06* (2013.01); *B29C 2035/0822* (2013.01); *H01L 2224/45139* (2013.01); *H01L 2224/48091* (2013.01); *Y02P 60/85* (2015.11)

(58) Field of Classification Search
   CPC ... B29B 2911/1404; B29B 2911/14106; B29B 2911/14033; B29B 2911/14133; B29B 2911/14213; B29C 49/64; B29C 49/78; B29C 35/08; B29C 2035/0822; H05B 3/0057; A23L 3/005; A23L 3/26; A23L 1/0128; A23L 1/0257
   USPC ...................... 264/454, 458; 425/174.4, 526; 372/45.01, 50.124; 257/14
   See application file for complete search history.

(56) References Cited

U.S. PATENT DOCUMENTS

| | | |
|---|---|---|
| 3,037,443 A | 6/1962 | Newkirk et al. |
| 3,242,804 A | 3/1966 | Brinkmann |
| 3,304,406 A | 2/1967 | King |
| 3,309,553 A | 3/1967 | Kroemer |
| 3,456,579 A | 7/1969 | Woods |
| 3,632,200 A | 1/1972 | Frey |
| 3,632,249 A | 1/1972 | Pearson |
| 3,765,813 A | 10/1973 | Moore |
| 3,899,611 A | 8/1975 | Hall |
| 4,009,042 A | 2/1977 | Rittler |
| 4,018,612 A | 4/1977 | Chyung |
| 4,020,232 A | 4/1977 | Kohmura et al. |
| 4,058,699 A | 11/1977 | Van Vloten |
| 4,096,369 A | 6/1978 | Tanaka et al. |
| 4,097,715 A | 6/1978 | Frizzi |
| 4,115,280 A | 9/1978 | Pratt, Jr. |
| 4,135,077 A | 1/1979 | Wills |
| 4,147,487 A | 4/1979 | Dickson et al. |
| 4,163,238 A | 7/1979 | Esaki et al. |
| 4,224,096 A | 9/1980 | Osborne |
| 4,228,345 A | 10/1980 | Stricker et al. |
| 4,304,978 A | 12/1981 | Saunders |
| 4,331,858 A | 5/1982 | Wagner |
| 4,374,678 A | 2/1983 | Castro |
| 4,455,319 A | 1/1984 | Clark |
| 4,453,806 A | 6/1984 | Wick |
| 4,456,811 A | 6/1984 | Hella et al. |
| 4,459,458 A | 7/1984 | Vetsch et al. |
| 4,481,405 A | 11/1984 | Malick |
| 4,486,639 A | 12/1984 | Mittelsteadt |
| 4,507,538 A | 3/1985 | Brown et al. |
| 4,606,723 A | 8/1986 | Pasternicki |
| 4,617,439 A | 10/1986 | Lespinats et al. |
| 4,665,298 A | 5/1987 | La Rocca |
| 4,672,169 A | 6/1987 | Chambers |
| 4,692,583 A | 9/1987 | Kimura et al. |
| 4,720,480 A | 1/1988 | Ito et al. |
| 4,754,141 A | 6/1988 | Mindock |
| 4,764,561 A | 8/1988 | Kiss et al. |
| 4,810,092 A | 3/1989 | Auth |
| 4,816,694 A | 3/1989 | Kuppenheimer, Jr. et al. |
| 4,820,682 A | 4/1989 | Shimomura et al. |
| 4,820,686 A | 4/1989 | Ito et al. |
| 4,840,933 A | 6/1989 | Usami et al. |
| 4,857,501 A | 8/1989 | Usami et al. |
| 4,865,748 A | 9/1989 | Morse |
| 4,894,509 A | 1/1990 | Chalco et al. |
| 4,899,908 A | 2/1990 | Kardiak |
| 4,900,891 A | 2/1990 | Vega et al. |
| 4,923,847 A | 5/1990 | Ito et al. |
| 4,929,411 A | 5/1990 | Usami et al. |
| 4,948,937 A | 8/1990 | Blank et al. |
| 4,989,791 A | 2/1991 | Ridenour |
| 4,999,333 A | 3/1991 | Usami et al. |
| 5,010,659 A | 4/1991 | Trevelen |
| 5,028,580 A | 7/1991 | Shimomura et al. |
| 5,036,179 A | 7/1991 | Westerberg et al. |
| 5,061,836 A | 10/1991 | Martin |
| 5,066,222 A | 11/1991 | Roos et al. |
| 5,068,512 A | 11/1991 | Van Geel et al. |
| 5,110,209 A | 5/1992 | Elshoud et al. |
| 5,130,292 A | 7/1992 | Ito et al. |
| 5,146,239 A | 9/1992 | Ono |
| 5,160,556 A | 11/1992 | Hyde et al. |
| 5,163,179 A | 11/1992 | Pellegrini |
| 5,178,990 A | 1/1993 | Satake et al. |
| 5,206,039 A | 4/1993 | Valyi |
| 5,208,434 A | 5/1993 | Minamida et al. |
| 5,246,910 A | 9/1993 | Koshizuka et al. |
| 5,250,775 A | 10/1993 | Maehara et al. |
| 5,256,341 A | 10/1993 | Denis et al. |
| 5,258,825 A | 11/1993 | Reed et al. |
| 5,260,258 A | 11/1993 | Ito et al. |
| 5,260,715 A | 11/1993 | Kishimi |
| 5,261,415 A | 11/1993 | Dussault |
| 5,270,285 A | 12/1993 | Ito et al. |
| 5,288,471 A | 2/1994 | Corner |
| 5,293,019 A | 3/1994 | Lee |
| 5,305,297 A | 4/1994 | Nishiuchi et al. |
| 5,308,233 A | 5/1994 | Denis et al. |
| 5,318,362 A | 6/1994 | Schietinger et al. |
| 5,322,651 A | 6/1994 | Emmer |
| 5,340,418 A | 8/1994 | Wei |
| 5,349,211 A | 9/1994 | Kato |
| 5,352,652 A | 10/1994 | Ito et al. |
| 5,364,645 A | 11/1994 | Lagunas-Solar |
| 5,382,441 A | 1/1995 | Lentz et al. |
| 5,408,488 A | 4/1995 | Kurihara et al. |
| 5,439,872 A | 8/1995 | Ito et al. |
| 5,457,299 A | 10/1995 | Blais et al. |
| 5,509,733 A | 4/1996 | Danley |
| 5,517,005 A | 5/1996 | Westerberg et al. |
| 5,553,532 A | 9/1996 | de la Luz-Martinez et al. |
| 5,565,119 A | 10/1996 | Behun et al. |
| 5,567,459 A | 10/1996 | Gonzalez-Hernandez et al. |
| 5,589,210 A | 12/1996 | De La Luz Martinez et al. |
| 5,607,711 A | 3/1997 | Lagunas-Solar |
| 5,610,930 A | 3/1997 | Macomber et al. |
| 5,611,987 A | 3/1997 | Kato et al. |
| 5,643,620 A | 7/1997 | Brun, Jr. |
| 5,658,667 A | 8/1997 | Yoshida et al. |
| 5,665,259 A | 9/1997 | Westerberg |
| 5,681,521 A | 10/1997 | Emmer et al. |
| 5,691,989 A | 11/1997 | Rakuljic et al. |
| 5,695,669 A | 12/1997 | Westerberg |
| 5,698,866 A | 12/1997 | Doiron et al. |
| 5,714,249 A | 2/1998 | Yoshida et al. |
| 5,721,286 A | 2/1998 | Lauf et al. |
| 5,726,423 A | 3/1998 | Westerberg et al. |
| 5,736,713 A | 4/1998 | Westerberg |
| 5,740,314 A | 4/1998 | Grimm |
| 5,741,583 A | 4/1998 | Yoshida |
| 5,773,149 A | 6/1998 | Yoshida et al. |

(56) References Cited

U.S. PATENT DOCUMENTS

| | | |
|---|---|---|
| 5,780,821 A | 7/1998 | Choi et al. |
| 5,820,820 A | 10/1998 | Pierce |
| 5,823,474 A | 10/1998 | Nunnally |
| 5,834,313 A | 11/1998 | Lin |
| 5,882,797 A | 3/1999 | Yoshida et al. |
| 5,883,362 A | 3/1999 | Pettibone et al. |
| 5,886,313 A | 3/1999 | Krause et al. |
| 5,888,644 A | 3/1999 | Yoshida et al. |
| 5,909,037 A | 6/1999 | Rajkomer et al. |
| 5,910,264 A | 6/1999 | Dauliach |
| 5,925,710 A | 7/1999 | Wu et al. |
| 5,928,220 A * | 7/1999 | Shimoji ............... A61B 18/201 372/9 |
| 5,935,709 A | 8/1999 | Yoshida |
| 5,953,356 A | 9/1999 | Botez et al. |
| 5,954,980 A | 9/1999 | Westerberg et al. |
| 5,958,271 A | 9/1999 | Westerberg et al. |
| 5,976,450 A | 11/1999 | Mreijen |
| 5,985,203 A | 11/1999 | Bowkett |
| 6,011,242 A | 1/2000 | Westerberg |
| 6,013,900 A | 1/2000 | Westerberg et al. |
| 6,018,144 A | 1/2000 | Vogt et al. |
| 6,018,146 A | 1/2000 | Uzgiris et al. |
| RE36,561 E | 2/2000 | Saito et al. |
| 6,022,920 A | 2/2000 | Maxwell et al. |
| 6,037,580 A | 3/2000 | Renk |
| 6,038,786 A | 3/2000 | Aisenberg et al. |
| 6,057,528 A | 5/2000 | Cook |
| 6,069,345 A | 5/2000 | Westerberg |
| RE36,724 E | 6/2000 | Westerberg et al. |
| 6,080,146 A | 6/2000 | Altshuler et al. |
| 6,080,436 A | 6/2000 | Lenahan |
| 6,106,761 A | 8/2000 | Sjoberg et al. |
| 6,113,837 A | 9/2000 | Erickson |
| 6,113,840 A | 9/2000 | Emmer et al. |
| 6,133,551 A | 10/2000 | Morrison |
| 6,146,677 A | 11/2000 | Moreth |
| 6,151,338 A | 11/2000 | Grubb et al. |
| 6,174,388 B1 | 1/2001 | Sikka et al. |
| 6,174,404 B1 | 1/2001 | Klinger |
| 6,193,931 B1 | 2/2001 | Lin et al. |
| 6,204,492 B1 | 3/2001 | Zeng et al. |
| 6,206,325 B1 | 3/2001 | Nunnally |
| 6,294,769 B1 | 9/2001 | McCarter |
| 6,335,941 B1 | 1/2002 | Grubb et al. |
| 6,347,007 B1 | 2/2002 | Grubb et al. |
| 6,348,676 B2 | 2/2002 | Kim et al. |
| 6,357,504 B1 | 3/2002 | Patel et al. |
| 6,359,256 B1 | 3/2002 | Biermann et al. |
| 6,361,301 B1 | 3/2002 | Scaglotti et al. |
| 6,372,318 B1 | 4/2002 | Collette et al. |
| 6,400,737 B1 | 4/2002 | Broutin et al. |
| 6,384,381 B2 | 5/2002 | Witt et al. |
| 6,387,089 B1 | 5/2002 | Kreindel et al. |
| 6,417,481 B2 | 7/2002 | Chen et al. |
| 6,433,306 B1 | 8/2002 | Grubb et al. |
| 6,437,292 B1 | 8/2002 | Sikka et al. |
| 6,444,946 B1 | 9/2002 | Korte |
| 6,450,941 B1 | 9/2002 | Larsen |
| 6,451,152 B1 | 9/2002 | Holmes |
| 6,460,735 B1 | 10/2002 | Greenwald et al. |
| 6,461,929 B1 | 10/2002 | Löbl et al. |
| 6,476,345 B1 | 11/2002 | Sator |
| 6,482,672 B1 | 11/2002 | Hoffman et al. |
| 6,503,586 B1 | 1/2003 | Wu et al. |
| 6,507,042 B1 | 1/2003 | Mukai et al. |
| 6,560,893 B1 | 5/2003 | Bakalar |
| 6,573,527 B1 | 6/2003 | Sugiyama et al. |
| 6,594,090 B2 | 7/2003 | Kruschwitz et al. |
| 6,605,080 B1 * | 8/2003 | Altshuler ............ A61B 18/203 606/13 |
| 6,610,969 B2 | 8/2003 | Feher |
| 6,617,539 B1 | 9/2003 | Koinuma et al. |
| 6,621,039 B2 | 9/2003 | Wang et al. |
| 6,638,413 B1 | 10/2003 | Weinberg et al. |
| 6,660,968 B1 | 12/2003 | Mottelet et al. |
| 6,667,111 B2 | 12/2003 | Sikka et al. |
| 6,670,570 B2 | 12/2003 | Giacobbe et al. |
| 6,710,281 B1 | 3/2004 | Wachnuk |
| 6,815,206 B2 | 11/2004 | Lin et al. |
| 6,818,864 B2 | 11/2004 | Ptak |
| 6,826,267 B2 | 11/2004 | Daum |
| 6,845,635 B2 | 1/2005 | Watanabe et al. |
| 6,857,368 B2 | 2/2005 | Pitz |
| 6,892,927 B2 | 5/2005 | Rumer et al. |
| 6,914,226 B2 | 7/2005 | Ottaway |
| 6,915,734 B2 | 7/2005 | Torghele et al. |
| 6,928,235 B2 | 8/2005 | Pollack |
| 6,967,716 B1 | 11/2005 | Cochran et al. |
| 7,009,140 B2 | 3/2006 | Partio et al. |
| 7,015,422 B2 | 3/2006 | Timans |
| 7,019,271 B2 | 3/2006 | Wnek et al. |
| 7,060,942 B2 | 6/2006 | Friedl et al. |
| 7,063,820 B2 | 6/2006 | Goswami |
| 7,118,563 B2 | 10/2006 | Weckwerth et al. |
| 7,150,552 B2 | 12/2006 | Weidel |
| 7,166,821 B2 | 1/2007 | Adamski |
| 7,173,216 B2 | 2/2007 | Ptak |
| 7,184,614 B2 | 2/2007 | Slatkine |
| 7,220,378 B2 | 5/2007 | Cochran et al. |
| 7,231,871 B1 | 6/2007 | Wilbers |
| 7,307,243 B2 | 12/2007 | Farkas et al. |
| 7,319,213 B2 | 1/2008 | Tsontzidis et al. |
| 7,336,895 B2 | 2/2008 | Okazaki |
| 7,351,252 B2 | 4/2008 | Altshuler |
| 7,616,872 B2 | 11/2009 | Camm et al. |
| 7,800,023 B2 | 9/2010 | Burtea et al. |
| 7,805,065 B2 | 9/2010 | Chan |
| 8,017,923 B2 | 9/2011 | Inoue et al. |
| 8,097,857 B2 | 1/2012 | Cochran et al. |
| 8,229,291 B2 | 7/2012 | Chan |
| 8,442,084 B2 | 5/2013 | Ungar |
| 8,546,277 B2 | 10/2013 | Plantamura |
| 10,687,391 B2 * | 6/2020 | Cochran ............ H05B 3/0057 |
| 2002/0005892 A1 | 1/2002 | Herre |
| 2002/0062161 A1 | 5/2002 | Dusterhoft |
| 2002/0088800 A1 | 7/2002 | Miller |
| 2002/0172736 A1 | 11/2002 | Chasles et al. |
| 2002/0190659 A1 | 12/2002 | Cao |
| 2003/0002548 A1 | 1/2003 | Boscha |
| 2003/0003296 A1 * | 1/2003 | Dries et al. ................ 428/336 |
| 2003/0010988 A1 | 1/2003 | Franson |
| 2003/0116561 A1 | 6/2003 | Shon et al. |
| 2003/0147159 A1 | 8/2003 | Dube et al. |
| 2003/0175412 A1 | 9/2003 | Bar et al. |
| 2004/0010298 A1 | 1/2004 | Altshuler et al. |
| 2004/0026400 A1 | 2/2004 | Ptak |
| 2004/0056006 A1 | 3/2004 | Jones et al. |
| 2005/0000641 A1 | 1/2005 | Hartmann |
| 2005/0077280 A1 | 4/2005 | Ptak |
| 2005/0092318 A1 | 5/2005 | Haustein |
| 2005/0123659 A1 | 6/2005 | Torghele et al. |
| 2005/0173400 A1 | 8/2005 | Cavada |
| 2005/0180482 A1 | 8/2005 | Osowski et al. |
| 2005/0228428 A1 | 10/2005 | Ali et al. |
| 2005/0274398 A1 | 12/2005 | Fonville et al. |
| 2006/0011604 A1 | 1/2006 | Evrard et al. |
| 2006/0048881 A1 | 3/2006 | Evans et al. |
| 2006/0081135 A1 | 4/2006 | Britton et al. |
| 2006/0097417 A1 | 5/2006 | Emmer |
| 2006/0118983 A1 | 6/2006 | Cochran et al. |
| 2006/0280825 A1 | 12/2006 | Cochran et al. |
| 2006/0281833 A1 | 12/2006 | Smith et al. |
| 2007/0012307 A1 | 1/2007 | Wiker et al. |
| 2007/0023661 A1 | 2/2007 | Wagner et al. |
| 2007/0096352 A1 | 5/2007 | Cochran et al. |
| 2008/0099961 A1 | 5/2008 | Feuilloley et al. |
| 2008/0245788 A1 | 10/2008 | Choong et al. |
| 2008/0264406 A1 | 10/2008 | Burtea et al. |
| 2009/0102083 A1 | 4/2009 | Cochran et al. |
| 2009/0127478 A1 | 5/2009 | Inoue et al. |
| 2009/0214690 A1 | 8/2009 | Feuilloley et al. |
| 2010/0007061 A1 | 1/2010 | Feuilloley et al. |
| 2010/0072673 A1 | 3/2010 | Feuilloley et al. |

(56) References Cited

U.S. PATENT DOCUMENTS

| | | |
|---|---|---|
| 2010/0080542 A1 | 4/2010 | Tartock |
| 2010/0089906 A1 | 4/2010 | Plantamura |
| 2010/0127435 A1 | 5/2010 | Feuilloley |
| 2011/0002675 A1 | 1/2011 | Cochran et al. |
| 2011/0002677 A1 | 1/2011 | Cochran et al. |
| 2011/0059211 A1 | 3/2011 | Chandi et al. |
| 2011/0067726 A1 | 3/2011 | Cochran et al. |
| 2011/0147374 A1 | 6/2011 | Obst et al. |
| 2012/0063753 A1 | 3/2012 | Cochran et al. |
| 2012/0134654 A1 | 5/2012 | Chan |
| 2012/0134655 A1 | 5/2012 | Chan |
| 2012/0196011 A1 | 8/2012 | Felix |
| 2012/0319016 A1 | 12/2012 | Kulhman et al. |
| 2013/0008318 A1 | 1/2013 | McPherson et al. |
| 2013/0056649 A1 | 3/2013 | Feuilloley et al. |

FOREIGN PATENT DOCUMENTS

| | | |
|---|---|---|
| CN | 2147089 Y | 11/1993 |
| CN | 2310523 Y | 3/1999 |
| CN | 2619776 Y | 6/2004 |
| CN | 201098016 Y | 8/2008 |
| DE | 42 34 342 A1 | 4/1994 |
| DE | 196 03 974 B4 | 8/1997 |
| DE | 101 06 607 A1 | 9/2002 |
| DE | 101 31 620 A1 | 1/2003 |
| DE | 101 47 664 A1 | 4/2003 |
| EP | 0 040 528 A1 | 11/1981 |
| EP | 0 322 353 B1 | 8/1993 |
| EP | 0 895 719 A1 | 2/1999 |
| EP | 0 938 962 B1 | 9/1999 |
| EP | 1575755 A1 | 9/2005 |
| EP | 1587664 A1 | 10/2005 |
| FR | 2 762 799 A1 | 11/1998 |
| FR | 2848906 A1 | 12/2002 |
| FR | 2872734 A1 | 7/2004 |
| FR | 2 878 185 A1 | 5/2006 |
| JP | 57-023727 A | 2/1982 |
| JP | 57-080030 | 5/1982 |
| JP | 58-043751 A | 3/1983 |
| JP | 59-014778 A | 1/1984 |
| JP | 59-184626 | 10/1984 |
| JP | 01-108940 A | 4/1989 |
| JP | H02286218 A | 11/1990 |
| JP | 04-254234 A | 9/1992 |
| JP | 05-200843 A | 8/1993 |
| JP | 06-105642 A | 4/1994 |
| JP | 6-105642 A | 4/1994 |
| JP | 07-040955 A | 2/1995 |
| JP | 7-49126 A | 2/1995 |
| JP | 07-049126 A | 2/1995 |
| JP | 09-027388 A | 1/1997 |
| JP | 09-042685 A | 2/1997 |
| JP | 9-42685 A | 2/1997 |
| JP | 09-145066 A | 6/1997 |
| JP | 09-293587 A | 11/1997 |
| JP | 10-014776 A | 1/1998 |
| JP | 10-249930 A | 9/1998 |
| JP | 11-342083 A | 12/1999 |
| JP | 2000-205573 A | 7/2000 |
| JP | 2001-027417 A | 1/2001 |
| JP | 2001-245582 A | 9/2001 |
| JP | 2001-245645 A | 9/2001 |
| JP | 2002026452 (A) | 1/2002 |
| JP | 2002-147762 A | 5/2002 |
| JP | 2002147762 A * | 5/2002 |
| JP | 2003-190024 A | 7/2003 |
| JP | 2004-111765 A | 4/2004 |
| JP | 2005-040475 A | 2/2005 |
| JP | 2005-40475 A | 2/2005 |
| JP | 2005-172779 A | 6/2005 |
| JP | 2005-237464 A | 9/2005 |
| JP | 2005-261613 A | 9/2005 |
| JP | 2008124358 (A) | 5/2008 |
| KR | 2000-0009949 A | 2/2000 |
| RU | 2048272 C1 | 11/1995 |
| RU | 2124280 C1 | 12/1998 |
| RU | 2157958 C1 | 10/2000 |
| RU | 2186681 C1 | 8/2002 |
| RU | 36622 U1 | 3/2004 |
| WO | WO 97/16080 A1 | 5/1997 |
| WO | WO 98/42050 A1 | 9/1998 |
| WO | WO 00/15097 A2 | 3/2000 |
| WO | WO 01/47397 A1 | 7/2001 |
| WO | WO 02/32652 A1 | 4/2002 |
| WO | WO 03/082545 A2 | 10/2003 |
| WO | WO 2004/009318 A1 | 1/2004 |
| WO | WO2005065917 A1 | 7/2005 |
| WO | WO2005068161 A1 | 7/2005 |
| WO | WO2005123367 A1 | 12/2005 |
| WO | WO2006010694 A1 | 2/2006 |
| WO | WO2006045926 A1 | 5/2006 |
| WO | WO 2006/060690 A2 | 6/2006 |
| WO | WO2006056673 A1 | 6/2006 |
| WO | WO/2006/128102 A2 | 11/2006 |
| WO | WO 2008/075280 A1 | 6/2008 |
| WO | WO 2008/154503 A2 | 12/2008 |
| WO | WO 2012/125118 A1 | 9/2012 |

OTHER PUBLICATIONS

"Lasers Offer New Medical and Cosmetic Treatment Options for Patients with Skin of Color," American Academy of Dermatology, press release, Chicago, IL, Jul. 17, 2003.

"Photodynamic therapy of actinic keratoses with topical aminolevulinic acid hydrochloride and fluorescent blue light," Journal of the American Academy of Dermatology, vol. 45, part 1, No. 1, Jul. 2001.

"Low Energy Photon (LEPT)—Light Emitting Diode (LED)—Light Therapy," Allied Light Therapy, Mar. 3, 2004.

"Medical Issue: Laser Treatement of Rosacea," Google Answers, May 6, 2003.

"Intense Pulsed Light," www.yestheyrefake.net excerpt, Apr. 20, 2004.

"Lasers in dermatology: Four decades of progress," Journal of the American Academy of Dermatology, vol. 49, Jul. 23, 2003.

"Skin Contact Monochromatic Infrared Energy," Blue Cross of California, Medical Policy 2.01.22.

"Combination Therapies Offer New Management Options for Acne and Rosacea," American Academy of Dermatology, press release, New York, NY, Oct. 17, 2001.

"Pulse-Light Treatments Get the Red Out," Health Leader archive 010927, Mar. 3, 2004.

"Phototherapy treatment of psoriasis today," Journal of the American Academy of Dermatology, vol. 49, part 2, No. 2, Aug. 2003.

Wiese, Arne, "Potential Savings for Preform Heating by Using NIR Technology," PETnology Europe 2007 Conference Presentation (Mar. 26, 2007) (16 pages).

Alaiti, Samer, et al. "Tacrolimus (FK506) Ointment for Atopic Dermatitis: A Phase I Study in Adults and Children." Journal of the American Academy of Dermatology. Jan. 1998, vol. 38, No. 1, pp. 69-76.

Feldman, Steven R., et al. "Destructive Procedures are the Standard of Care for Treatment of Actinic Keratoses." Journal of the American Academy of Dermatology. Jan. 1999, vol. 40, No. 1, pp. 43-47.

Fleischer, Alan B. et al. "Procedures for Skin Diseases Performed by Physicians in 1993 and 1994: Analysis of data from the National Ambulatory Medical Care Survey." Journal of the American Academy of Dermatology. Nov. 1997, part 1, vol. 37, No. 5, pp. 719-724.

Friedlander, S. F., et al. "Severe and Extensive Atopic Dermatitis in Children as Young as 3 Months." Journal of the American Academy of Dermatology. Mar. 2002, vol. 46, No. 3, pp. 387-393.

Gold, Michael H. "A Single Center, Open Label Investigator Study of Photodynamic Therapy in the Treatment of Sebaceous gland hyperplasia with Topical 20% 5-Aminolevulinic Acid with visible blue light or Intense Pulsed Light." Journal of the American Academy of Dermatology. Mar. 2004, part 2, vol. 50, No. 3, p. P164.

(56) References Cited

OTHER PUBLICATIONS

Goyal, A.K. et al. "Wavelength Beam Combining of Mid-IR Semiconductor Lasers," *Lasers and Electro-Optics Society, 2001. LEOS 2001. The 14th Annual Meeting of the IEEE* © 2001, pp. 532-533.
Hanifin, Jon M., et al. "Tacrolimus Ointment for the Treatment of Atopic Dermatitis in Adult Patients: Part I, Efficacy." Journal of the American Academy of Dermatology. Jan. 2001, part 2, vol. 44, No. 1, pp. S28-S38.
Hecker, David, et al. "Interactions Between Tazarotene and Ultraviolet Light." Journal of the American Academy of Dermatology. Dec. 1999, vol. 41, No. 6, pp. 927-930.
"Infrared Heat for Glass Processing," www.heraeus-noblelight.com excerpt, Aug. 31, 2004.
Lebwohl, Mark, et al. "Interactions Between Calcipotriene and Ultraviolet Light." Journal of the American Academy of Dermatology. Jul. 1997, vol. 37, No. 1, pp. 93-95.
Morton, Colin A., et al. "The Efficacy of Violet Light in the Treatment of Acne." Journal of the American Academy of Dermatology. Mar. 2004, part 2, vol. 50, No. 3, p. P15.
"MR-IR LEDs" www.roithner-laser.com excerpt, Aug. 4, 2004.
Nestor, Mark S. "Combination Phototherapy and Adapalene in the Treatment of Acne Vulgaris." Journal of the American Academy of Dermatology. Mar. 2004, part 2, vol. 50, No. 3, p. P170.
Paller, Amy, et al. "A 12-Week Study of Tacrolimus Ointment for the Treatment of Atopic Dermatitis in Pediatric Patients." Journal of the American Academy of Dermatology. Jan. 2001, part 2, vol. 44, No. 1, pp. S47-S57.
Rattunde, M. et al. "Power Efficiency of GaSb Based 2.0 μm Diode Lasers," *Lasers and Electro-Optics Society, 2001. LEOS 2001. The 14th Annual Meeting of the IEEE* © 2001, pp. 530-531.
Soter, Nicholas A, et al. "Tacrolimus Ointment for the Treatment of Atopic Dermatitis in Adult Patients: Part II, Safety." Journal of the American Academy of Dermatology. Jan. 2001, part 2, vol. 44, No. 1, pp. S39-S46.
Wagner, Joachim. "Diode Lasers for High-Power Applications at 2 μm," White Paper, Fraunhofer Institute, Germany © 2001, pp. 24-25.
Wolfe, William L., Zissis, George J., Eds. *The Infrared Handbook*. Environmental Research Institute of Michigan. © 1989 pp. (5-56)-)(5-57).
Supplementary European Search Report, dated Jan. 13, 2009.
"Nice[3] and Coors—UV-Curable Coatings for Aluminum Can Production," Bob Brady, (publication source and date unknown but appears to be authored approximately 1994-1995 based on last line of p. 1).
Consideration of SIPO (China) statement (contained in Apr. 15, 2015 document) described in accompanying Information Disclosure Statement.
http://www.thorlabs.com/NewGroupPage9_PF.cfm?Guide=10 &Categ . . ., Thorlabs, Engineered Diffusers, 7 pages, printed Apr. 5, 2013.
Evans, "BMW's Laser Headlights—BMW Shows us How its Freakin' Laser Light Show works," 5 pages, printed Jan. 3, 2012 (copyright 2012).
http://inhabitat.com/dont-make-eye-contact-electric-audi-a2-concept-will-pac . . ., Laura K. Cowan, "Don't Make Eye Contact: Electric Audi A2 Concept Will Pack Laser Tail Lights," 9 pages, printed Oct. 23, 2019 (dated Sep. 8, 2011).
http://rayotek.com/tech-specs/material-comparisons.htm, "Choosing the Right Material What is the difference between glass and crystalline material?" Rayotek Scientific Inc. Synthetic Sapphira vs. Glass, Fused Quartz & Silica, (4 pages—Wayback Machine—Internet Archive, Dec. 4, 2011; 3 pages printed Dec. 19, 2011).
Tasso R. M. Sales, Structured Microlens Arrays for Beam Shaping, Proceedings of SPIE vol. 5175 Laser Beam Shaping IV, pp. 109-120, 2003.
Tasso Sales et al., Microlens diffusers and beam shapers for light-emitting diode (LED) sources, Optics InfoBase, pp. 1-2, printed Apr. 5, 2013.

* cited by examiner

METHOD AND SYSTEM FOR WAVELENGTH SPECIFIC THERMAL IRRADIATION AND TREATMENT

This application is a continuation of and claims the priority benefit of U.S. application Ser. No. 11/003,679, filed Dec. 3, 2004, which is now U.S. Pat. No. 7,425,296, the disclosure of which is incorporated herein by reference.

BACKGROUND OF THE INVENTION

This invention relates to the direct injection of selected thermal-infrared (IR) wavelength radiation or energy into targeted entities for a wide range of heating, processing, or treatment purposes. As will be described below, these purposes may include heating, raising or maintaining the temperature of articles, or stimulating a target item in a range of different industrial, medical, consumer, or commercial circumstances. The methods and system described herein are especially applicable to operations that require or benefit from the ability to irradiate at specifically selected wavelengths or to pulse or inject the radiation. The invention is particularly advantageous when the target is moving at higher speeds and in a non-contact environment with the target. The invention provides for an infrared system of selected narrow wavelengths which is highly programmable for a wide range of end applications. The invention teaches a new and novel type of infrared irradiation system which is comprised of engineered arrays of most preferably a new class of narrow wavelength solid-state radiation emitting devices (REDs), one variant of which will be specifically referenced later in this document.

More specifically, this invention is directed to a novel and efficient way of injecting an optimal wavelength of infrared radiation into a target for the purpose of, in some way, affecting the target's temperature. To cite a small sampling of examples, the "target" for the infrared injection may be from a wide variety of items ranging from individual components in a manufacturing operation, to a region of treatment on a continuous coil of material, to food in a cooking process, or to human patients in a medical treatment environment.

Though the specific embodiment of the invention described hereafter is an example that relates particularly to a plastic bottle preform reheat operation, the concepts contained within also apply to many other noted scenarios. It also applies to single-stage plastic bottle blowing operations wherein the injection-molding operation is performed serially, just prior to the blow-molding operation. In this deployment, for example, the methods and apparatus of the subject invention offer similar advantages over the known art, but would employ different sensing and controls to deal with the variation in initial temperature at the entrance to the reheat section of the process.

In general, an ideal infrared heating system optimally raises the temperature of a target with the least energy consumption. Such a system may comprise a device that can directly convert its electrical power input to a radiant electromagnetic energy output, with the chosen single or narrow band wavelengths that are aimed at a target, such that the energy comprising the irradiation is partially or fully absorbed by the target and converted to heat. The more efficiently the electrical input is converted to radiant electromagnetic output, the more efficiently the system can perform. The more efficiently the radiant electromagnetic waves are aimed to expose only the desired areas on the target, the more efficiently the system will accomplish its work. The radiation emitting device chosen for use should have an instant "on" and instant "off" characteristic such that when the target is not being irradiated, neither the input nor the output energy is wasted. The more efficiently the exposed target absorbs the radiant electromagnetic energy to directly convert it to heat, the more efficiently the system can function. For an optimal system, care must be taken to properly select so that the set of system output wavelengths matches the absorptive characteristic of the target. These wavelengths likely will be chosen differently for different targeted applications of the invention to best suit the different absorption characteristics of different materials as well as to suit different desired results.

In contrast, it is well known in the art and industry to use a range of different types of radiant heating systems for a wide range of processes and treatments. Technologies that have been available previously for such purposes produce a relatively broad band spectrum of emitted radiant electromagnetic energy. They may be referred to as infrared heating, treatment, or processing systems whereas, in actual fact, they often produce radiant energy well outside the infrared spectrum.

The infrared portion of the spectrum is generally divided into three wavelength classifications. These are generally categorized as near-infrared, middle-infrared, and long-infrared wavelengths bands. While exact cutoff points are not clearly established for these general regions, it is generally accepted that the near-infrared region spans the range between visible light and 1.5 micrometers. The middle-infrared region spans the range from 1.5 to 5 micrometers. The long-wave-infrared region is generally thought to be between 5 and 14 micrometers and beyond.

The radiant infrared sources that have been used in industrial, commercial, and medical, heating treatment or process equipment previously produce a broad band of wavelengths which are rarely limited to one section of the infrared spectrum. Although their broad band output may peak in a particular range of the infrared spectrum, they typically have an output tail which extends well into adjacent regions.

As an example, quartz infrared heating lamps, which are well known in the art and are used for various process heating operations, will often produce a peak output in the 0.8 to 1 micrometer range. Although the output may peak between 0.8 and 1 micrometers, these lamps have substantial output in a wide continuous set of wavelength bands from the ultraviolet (UV) through the visible and out to about 3.5 micrometers in the middle-infrared. Clearly, although the peak output of a quartz lamp is in the near-infrared range, there is substantial output in both the visible range and in the mid-infrared ranges. It is, therefore, not possible with the existing broad spectrum infrared sources to be selective as to the preferred wavelength or wavelengths that would be the most desired for any given heating, processing or treatment application. It is inherently a wide spectrum treatment or process and has been widely used because there have not been practical alternatives before the present invention. The primary temperature rise in many targets is due to absorption of thermal IR energy at one or more narrow bands of wavelengths. Thus, much of the broadband IR energy output is wasted.

Nonetheless, quartz infrared lights are widely used in industry for both the discrete components and the continuous material processing industries. A variety of methodologies would typically be used to help direct the emission from the quartz lamps onto the target under process including a variety of reflector-types. Regardless of how the energy is focused onto the target, the quartz lamps are typically energized continuously. This is true whether the target under process is a continuously produced article or discrete components. The reason for this is primarily due to the relatively slow thermal response time of quartz lamps which typically measure on the order of seconds.

An area of specific need for improved energy injection relates to blow molding operations. More specifically, plastic bottle stretch blow-molding systems thermally condition preforms prior to stretch blow molding operations. One aspect of this process is known in the art as a reheat operation. In a reheat operation, preforms that have been formed by way of an injection molding or compression molding process are allowed to thermally stabilize to room temperature. At a later time, the preforms are fed into a stretch blow molding system, an early stage of which heats up the preforms to a temperature wherein the thermoplastic preform material is at a temperature optimized for subsequent blow-molding operations. This condition is met while the preforms are being transported through a heating section along the path to the blow molding section of the machine. In the blow molding section, the preforms are first mechanically stretched and then blown into vessels or containers of larger volume.

Energy consumption costs make up a large percentage of the cost of a finished article that is manufactured using blow molding operations. More specifically, the amount of energy required with the heretofore state-of-the-art technology to heat up or thermally condition Polyethylene Terephthalate (PET) preforms from ambient temperature to 105° C. in the reheat section of a stretch blow molding machine is quite substantial. From all manufacturing efficiently measures, it will be clearly advantageous from both an economic and an environmental standpoint to reduce the energy consumption rate associated with the operation of the thermal conditioning section of stretch blow molding systems.

U.S. Pat. No. 5,322,651 describes an improvement in the method for thermally treating thermoplastic preforms. In this patent, the conventional practice of using broadband infrared (IR) radiation heating for the thermal treatment of plastic preforms is described. Quoting text from this patent, "In comparison with other heating or thermal treatment methods such as convection and conduction, and considering the low thermal conductivity of the material, heating using infrared radiation gives advantageous output and allows increased production rates."

The particular improvement to the state-of-the-art described in this patent relates to the manner in which excess energy emitted during IR heating of the preforms is managed. In particular, this patent concerns itself with energy emitted during the heating process that ultimately (through absorption in places other than the preforms, conduction, and then convection) results in an increase in the air temperature in the oven volume surrounding the transported preforms. Convection heating of the preforms caused by hot air flow has proven to result in non-uniform heating of the preforms and, thus, has a deleterious effect on the manufacturing operation. U.S. Pat. No. 5,322,651 describes a method of counteracting the effects of the unintended heating of the air flow surrounding the preforms during IR heating operations.

As might be expected, the transfer of thermal energy from historical state-of-the-art IR heating elements and systems to the targeted preforms is not a completely efficient process. Ideally, 100% of the energy consumed to thermally condition preforms would end up within the volume of the preforms in the form of heat energy. Although it was not specifically mentioned in the above referenced patent, typical conversion efficiency values (energy into transported preforms/energy consumed by IR heating elements) in the range between 5% and 10% are claimed by the current state-of-the-art blow molding machines. Any improvement to the method or means associated with the infrared heating of preforms that improves the conversion efficiency values would be very advantageous and represents a substantial reduction in energy costs for the user of the stretch blow forming machines.

There are many factors that work together to establish the energy conversion efficiency performance of the IR heating elements and systems used in the current state-of-the-art blow molding machines. As noted, conventional thermoplastic preforms, such as PET preforms, are heated to a temperature of about 105° C. This is typically accomplished in state-of-the-art blow molding machines using commercially available broadband quartz infrared lamps. In high-speed/high-production machines these often take the form of large banks of very high wattage bulbs. The composite energy draw of all the banks of quartz lamps becomes a huge current draw amounting to many hundreds of kilowatts on the fastest machines. Two factors associated with these types of IR heating elements that have an effect on the overall energy conversion efficiency performance of the overall heating system are the color temperature of the lamp filament and the optical transmission properties of the filament bulb.

Another factor that has a significant impact on the overall energy conversion performance of the thermal conditioning subsystems of the current state-of-the-art blow molding machines is the flux control or lensing measures used to direct the IR radiation emitted by the heating elements into the volume of the preforms being transported through the system. In most state-of-the-art blow molding machines, some measures to direct the IR radiant flux emitted by quartz lamps into the volume of the preforms are being deployed. In particular, metallized reflectors work well to reduce the amount of emitted IR radiation that is wasted in these systems.

Still another factor that has an impact on the energy conversion efficiency performance of the IR heating subsystem is the degree to which input energy to the typically stationary IR heating elements is synchronized to the movement of the preforms moving through the heating system. More specifically, if a fixed amount of input energy is continuously consumed by a stationary IR heating element, even at times when there are no preforms in the immediate vicinity of the heater due to continuous preform movement through the system, the energy conversion efficiency performance of the systems is obviously not optimized. In practice, the slow physical response times of commercial quartz lamps and the relatively fast preform transfer speeds of state-of-the-art blow molding machines precludes any attempt of successfully modulating the lamp input power to synchronize it with discrete part movement and, thus, achieve an improvement in overall energy conversion efficiency performance.

U.S. Pat. No. 5,925,710, U.S. Pat. No. 6,022,920, and U.S. Pat. No. 6,503,586 B1 all describe similar methods to increase the percentage of energy emitted by IR lamps that is absorbed by transported preforms used in a blow molding process. All of these patents describe, in varying amounts of detail, the general practice in state-of-the-art reheat blow molding machines to use quartz lamps as the IR heating elements. In a reheat blow molding process, preforms that have previously been injection molded and allowed to stabilize to room temperature are reheated to blowing temperatures just prior to blow molding operations. These above reference patents describe how polymers in general, and PET in particular, can be heated more efficiently by IR absorption than is possible using conduction or convection means. These patents document in figures the measured absorption coefficient of PET as a function of wavelength. Numerous strong molecular absorption bands occur in PET, primarily in IR wavelength bands above 1.6 micrometer. Quartz lamps are known to emit radiation across a broad spectrum, the exact emission spectrum being determined by the filament temperature as defined by Planck's Law.

As used in existing state-of-the-art blow molding machines, quartz lamps are operated at a filament temperature of around 3000° K. At this temperature, the lamps have a peak radiant emission at around 0.8 micrometer. However, since the emission is a blackbody type emission, as it is known in the art, the quartz filament emits a continuous spectrum of energy from X-ray to very long IR. At 3000° K, the emission rises through the visible region, peaks at 0.8 micrometer, and then gradually decreases as it begins to overlap the regions of significant PET absorption starting at around 1.6 micrometer.

What is not described in any of these patents is the effect that the quartz bulb has on the emitted spectrum of the lamp. The quartz material used to fabricate the bulb of commercial quartz lamps has an upper transmission limit of approximately 3.5 micrometer. Beyond this wavelength, any energy emitted by the enclosed filament is, for the most part, absorbed by the quartz glass sheath that encloses the filament and is therefore not directly available for preform heating.

For the reasons outlined above, in existing state-of-the-art blow molding machines that use quartz lamps to reheat PET preforms to blowing temperatures, the range of absorptive heating takes place between 1 micrometer and 3.5 micrometer. The group of patents referenced above (U.S. Pat. Nos. 5,925,710, 6,022,920, and 6,503,586 B1) all describe different method and means for changing the natural absorption properties of the preform, thus improving the overall energy conversion efficiency performance of the reheat process. In all of these patents, foreign materials are described as being added to the PET preform stock for the sole purpose of increasing the absorption coefficient of the mixture. These described methods and means are intended to effect the materials optical absorption properties in the range from the near IR around 0.8 micrometer out to 3.5 micrometer. While being a viable means of increasing the overall energy conversion efficiency performance of the reheat process, the change in the absorption property of the preforms that is so beneficial in reducing the manufacturing costs of the container also has a deleterious effect on the appearance of the finished container. A reduction in the optical clarity of the container, sometimes referred to as a hazing of the container, acts to make this general approach a non-optimal solution to this manufacturing challenge.

U.S. Pat. No. 5,206,039 describes a one-stage injection molding/blow molding system consisting of an improved means of conditioning and transporting preforms from the injection stage to the blowing stage of the process. In this patent, the independent operation of an injection molding machine and a blow molding machine, each adding a significant amount of energy into the process of thermally conditioning the thermoplastic material, is described as wasteful. This patent teaches that using a single-stage manufacturing process reduces both overall energy consumption rates and manufacturing costs. This reduction in energy consumption comes primarily from the fact that most of the thermal energy required to enable the blow molding operation is retained by the preform following the injection molding stage. More specifically, in a one-stage process as described in the '039 patent, the preform is not allowed to stabilize to room temperature after the injection molding process. Rather, the preforms move directly from the injection molding stage to a thermal conditioning section and then on to the blow molding section.

The thermal conditioning section described in the '039 patent has the properties of being able to add smaller amounts of thermal energy as well as subjecting the preforms to controlled stabilization periods. This differs from the requirements of a thermal conditioning section in the 2-stage process of a reheat blow-molding machine wherein large amounts of energy are required to heat the preforms to the blowing temperature. Though the operation of single-stage injection molding/blow molding machines are known in the art, finished container quality problems persist for these machines. These quality problems are linked to preform-to-preform temperature variations as the stream of preforms enters the blowing stage. Despite the advances described in the '039 patent, using heretofore state-of-the-art IR heating and temperature sensing means and methods, the process of thermally conditioning preforms shortly after they have been removed from an injection molding process still results in preforms of varying thermal content entering the blowing stage. The variations in thermal content of the entering preforms result in finished containers of varying properties and quality. Inefficiencies in the ability to custom tune the IR heating process on a preform-to-preform basis results in manufacturers opting to use a reheat blow molding method to achieve required quality levels. For this reason, for the highest production applications, the industry's reliance on reheat methods persists. Also, because preforms are often manufactured by a commercial converter and sold to an end user who will blow and fill the containers, the re-heat process continues to be popular.

The prospect of generally improving the efficiency and/or functionality of the IR heating section of blow molding machines is clearly advantageous from both an operating cost as well as product quality perspective. Though several attempts have been made to render improvements in the state-of-the-art IR heating subsystems, clear deficiencies still persist. Through the introduction of novel IR heating elements and methods, it is the intention of the present invention to overcome these deficiencies.

In the solid state electronics realm, solid-state emitters or LEDs are well known in the art. Photon or flux emitters of this type are known to be commercially available and to operate at various wavelengths from the ultraviolet (UV) through the near-infrared. LEDs are constructed out of suitably N- and P-doped semiconductor material. A volume of semiconductor material suitably processed to contain a P-doped region placed in direct contact with an N-doped region of the same material is given the generic name of diode. Diodes have many important electrical and photo-electrical properties as is well known in the art. For example, it is well known within the art that, at the physical interface between an N-doped region and a P-doped region of a formed semiconductor diode, a characteristic bandgap exists in the material. This bandgap relates to the difference in energy level of an electron located in the conduction band in the N-region to the energy level of an electron in a lower available P-region orbital. When electrons are induced to flow across the PN-junction, electron energy level transitions from N-region conduction orbitals to lower P-region orbitals begin to happen resulting in the emission of a photon for each such electron transition. The exact energy level or, alternately, wavelength of the emitted photon corresponds to the drop in energy of the conducted electron.

In short, LEDs operate as direct current-to-photon emitters. Unlike filament or other blackbody type emitters, there is no requirement to transfer input energy into the intermediate form of heat prior to being able to extract an output photon. Because of this direct current-to-photon behavior, LEDs have the property of being extremely fast acting. LEDs have been used in numerous applications requiring the generation of extremely high pulse rate UV, visible, and/or near IR light. One specific application wherein the high pulse rate property of LEDs has been particularly useful is in automated discrete part vision sensing applications, where the visible or near infrared light is used to form a lens focused image which is then inspected in a computer.

Unlike filament-based sources, LEDs emit over a relatively limited wavelength range corresponding to the specific bandgap of the semiconductor material being used. This property of LEDs has been particularly useful in applications wherein wavelength-selective operations such as component illumination, status indication, or optical communication are required. More recently, large clusters of LEDs have been used for larger scale forms of visible illumination or even for signaling lights such as automotive tail lights or traffic signal lights.

SUMMARY OF THE INVENTION

The subject invention provides for the implementation of small or substantial quantities of infrared radiation devices that are highly wavelength selectable and can facilitate the use of infrared radiation for whole new classes of applications and techniques that have not been available historically.

An object of this invention is to provide a molding or other process or treatment system with a thermal IR heating system possessing improved IR energy conversion efficiency performance.

Another object of this invention is to provide an IR heating system having IR penetration depth performance tuned to the particular material being processed or targeted.

Another object of this invention is to provide a thermal IR radiation system which can incorporate an engineered mixture of REDs which produce IR radiation at such selected narrow wavelength bands as may be optimal for classes of applications.

Another object of this invention is to provide an IR heating system capable of being driven in a pulsed mode; said pulsed mode being particularly suited to providing IR heat to discretely manufactured parts as they are transported during the manufacturing process or to facilitate synchronous tracking of targets of the irradiation.

Another object of this invention is to provide IR heating elements that are more directable via metallized reflector elements.

Another object of this invention is to provide an IR heating system capable of working in conjunction with a preform temperature measurement system to provide preform-specific IR heating capability.

Another object of this invention is to provide IR heating elements that are fabricated as arrays of direct current-to-photon IR solid-state emitters or radiance emitting diodes (REDs).

Yet another advantage of this invention is to provide an infrared irradiation system of substantial radiant output at highly specific single or multiple narrow wavelength bands.

Yet another advantage of this invention is the functionality to produce powerful, thermal infrared radiation and to be highly programmable for at least one of position, intensity, wavelength, turn-on/turn-off rates, directionality, pulsing frequency, and product tracking.

Yet another advantage of the invention is the facilitation of a more input energy efficient methodology for injecting heat energy compared to current broadband sources.

Yet another advantage of the invention in heating bottle preforms is in retaining the ability to heat efficiently without requiring additives which reduce the visible clarity and appearance qualities of the finished container.

Yet another object of this invention is to provide a general radiant heating system for a wide range of applications to which it can be adapted to provide the increased functionality of wavelength selective infrared radiation in combination with the programmability and pulsing capability.

Yet another advantage of this invention is the ability to facilitate extremely fast high intensity burst pulses with much higher instantaneous intensity than steady state intensity.

Yet another advantage of the invention is that waste heat can be easily conducted away to another location where it is needed or can be conducted out of the using environment to reduce non-target heating.

Yet another advantage of the invention is that the RED devices can be packaged in high density to yield solid state, thermal IR output power levels that have heretofore not been practically attainable.

DETAILED DESCRIPTION OF THE INVENTION

Figure 1:
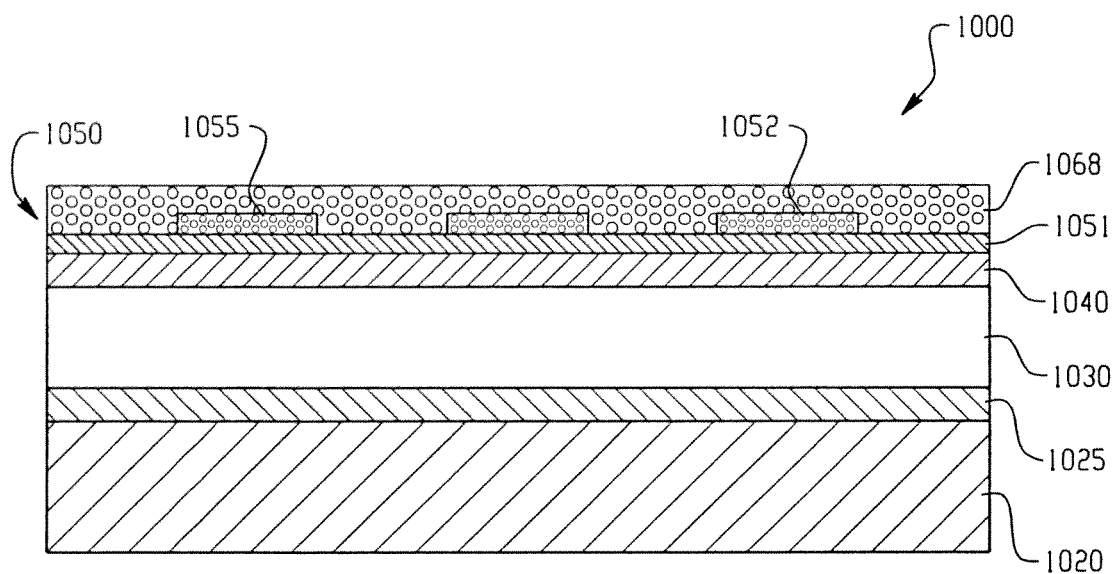
FIG. 1 is a cross-sectional view of a portion of an exemplary semiconductor device implemented in one embodiment of the present invention.

The benefits of providing wavelength specific irradiation can be illustrated by looking at a hypothetical radiant heating example. Assume that a material which is generally transparent to electromagnetic radiation from the visible range through the mid-infrared range requires process heating to support some manufacturing operation. Also assume that this generally transparent material has a narrow but significant molecular absorption band positioned between 3.0 and 3.25 micrometers. The example described above is representative of how the presently described embodiments might be most advantageously applied within industry. If the parameters of this particular process heating application dictated the use of radiant heating techniques, the current state-of-the-art would call for the use of quartz lamps operated at a filament temperature of approximately 3000° K. At this filament temperature, fundamental physical calculations yield the result that only approximately 2.1% of the total emitted radiant energy of a quartz lamp falls within the 3.0 to 3.25 micrometer band wherein advantageous energy absorption will occur. The ability to generate only wavelength-specific radiant energy output as described within this disclosure holds the promise of greatly improving the efficiency of various process heating applications.

The subject invention is directly related to a novel and new approach to be able to directly output substantial quantities of infrared radiation at selected wavelengths for the purpose of replacing such broadband type devices.

Recent advances in semiconductor processing technology have resulted in the availability of direct electron-to-photon solid-state emitters that operate in the general mid-infrared range above 1 micrometer (1,000 nanometers). These solid state devices operate analogous to common light emitting diodes (LEDs), only they do not emit visible light but emit true, thermal IR energy at the longer mid-infrared wavelengths. These are an entirely new class of devices which utilize quantum dot technology that have broken through the barriers which have prevented useable, cost effective solid state devices from being produced which could function as direct electron to photon converters whose output is pseudo-monochromatic and in the mid-infrared wavelength band.

To distinguish this new class of devices from the conventional shorter wavelength devices (LEDs), these devices are more appropriately described as radiance or radiation emitting diodes (REDs). The devices have the property of emitting radiant electromagnetic energy in a tightly limited wavelength range. Furthermore, through proper semiconductor processing operations, REDs can be tuned to emit at specific wavelengths that are most advantageous to a particular radiant treatment application.

In addition, innovations in RED technology related to the formation of a doped planar region in contact with an oppositely doped region formed as a randomly distributed array of small areas of material or quantum dots for generating photons in the targeted IR range and potentially beyond has evolved. This fabrication technique, or others such as the development of novel semiconductor compounds, adequately applied would yield suitable pseudo-monochromatic, solid-state mid-infrared emitters for the subject invention. Alternate semi-conductor technologies may also become available in both the mid-infrared as well as for long wavelength infrared that would be suitable building blocks with which to practice this invention.

Direct electron (or electric current)-to-photon conversions as contemplated within these described embodiments occur within a narrow wavelength range often referred to as pseudo-monochromatic, consistent with the intrinsic bandgap and quantum dot geometry of this fabricated diode emitter. It is anticipated that the half-power bandwidths of candidate RED emitters will fall somewhere within the 20-500 nanometer range. The narrow width of infrared emitters of this type should support a variety of wavelength-specific irradiation applications as identified within the content of this complete disclosure. One family of RED devices and the technology with which to make them are subject of a separate patent application, U.S. Application Ser. No. 60/628,330, filed on Nov. 16, 2004, entitled "Quantum Dot Semiconductor Device" and naming Samar Sinharoy and Dave Wilt as inventors; (Express Mail Label No. EL 726091609 US), which application is incorporated herein by reference.

According to this "Quantum Dot Semiconductor Device" application, semiconductor devices are known in the art. They are employed in photovoltaic cells that convert electromagnetic radiation to electricity. These devices can also be employed as light emitting diodes (LEDs), which convert electrical energy into electromagnetic radiation (e.g., light). For most semiconductor applications, a desired bandgap (electron volts) or a desired wavelength (microns) is targeted, and the semiconductor is prepared in a manner such that it can meet that desired bandgap range or wavelength range.

The ability to achieve a particular wavelength of emission or electron volt of energy is not trivial. Indeed, the semiconductor is limited by the selection of particular materials, their energy gap, their lattice constant, and their inherent emission capabilities. One technique that has been employed to tailor the semiconductor device is to employ binary or tertiary compounds. By varying the compositional characteristics of the device, technologically useful devices have been engineered.

The design of the semiconductor device can also be manipulated to tailor the behavior of the device. In one example, quantum dots can be included within the semiconductor device. These dots are believed to quantum confine carriers and thereby alter the energy of photon emission compared to a bulk sample of the same semiconductor. For example, U.S. Pat. No. 6,507,042 teaches semiconductor devices including a quantum dot layer. Specifically, it teaches quantum dots of indium arsenide (InAs) that are deposited on a layer of indium gallium arsenide ($In_xGa_{1-x}As$). This patent discloses that the emission wavelength of the photons associated with the quantum dots can be controlled by controlling the amount of lattice mismatching between the quantum dots (i.e., InAs) and the layer onto which the dots are deposited (i.e., $In_xGa_{1-x}As$). This patent also discloses the fact that the lattice mismatching between an $In_xGa_{1-x}As$ substrate and an InAs quantum dot can be controlled by altering the level of indium within the $In_xGa_{1-x}As$ substrate. As the amount of indium within the $In_xGa_{1-x}As$ substrate is increased, the degree of mismatching is decreased, and the wavelength associated with photon emission is increased (i.e., the energy gap is decreased). Indeed, this patent discloses that an increase in the amount of indium within the substrate from about 10% to about 20% can increase the wavelength of the associated photon from about 1.1 µm to about 1.3 µm.

While the technology disclosed in U.S. Pat. No. 6,507,042 may prove useful in providing devices that can emit or absorb photons having a wavelength of about 1.3 µm, the ability to increase the amount of indium within an $In_xGa_{1-x}$As substrate is limited. In other words, as the level of indium is increased above 20%, 30%, or even 40%, the degree of imperfections or defects within crystal structure become limiting. This is especially true where the $In_xGa_{1-x}$ As substrate is deposited on a gallium arsenide (GaAs) substrate or wafer. Accordingly, devices that emit or absorb photons of longer wavelength (lower energy gap) cannot be achieved by employing the technology disclosed in U.S. Pat. No. 6,507,042.

Accordingly, inasmuch as it would be desirable to have semiconductor devices that emit or absorb photons of wavelength longer than 1.3 µm, there remains a need for a semiconductor device of this nature.

In general, a RED provides a semiconductor device comprising an $In_xGa_{1-x}$As layer, where x is a molar fraction of from about 0.64 to about 0.72 percent by weight indium, and quantum dots located on said $In_xGa_{1-x}$As layer, where the quantum dots comprise InAs or $Al_zIn_{1-z}$As, where z is a molar fraction of less than about 5 percent by weight aluminum.

The present invention also includes a semiconductor device comprising a quantum dot comprising InAs or $Al_zIn_{1-z}$ As, where z is a molar fraction of less than about 5 percent by weight aluminum, and a cladding layer that contacts at least a portion of the quantum dot, where the lattice constant of the quantum dot and said cladding layer are mismatched by at least 1.8% and by less than 2.4%.

The semiconductor devices include a quantum dot layer including indium arsenide (InAs) or aluminum indium arsenide ($Al_zIn_{1-z}$As, where z is equal to or less than 0.05) quantum dots on an indium gallium arsenide ($In_xGa_{1-x}$As) layer, which may be referred to as an $In_xGa_{1-x}$As matrix cladding. The lattice constant of the dots and the $In_xGa_{1-x}$As matrix layer are mismatched. The lattice mismatch may be at least 1.8%, in other embodiments at least 1.9%, in other embodiments at least 2.0%, and in other embodiments at least 2.05%. Advantageously, the mismatch may be less than 3.2, in other embodiments less than 3.0%, in other embodiments less than 2.5%, and in other embodiments less than 2.2%. In one or more embodiments, the lattice constant of the $In_xGa_{1-x}$As matrix cladding is less than the lattice constant of the dots.

In those embodiments where the dots are located on an $In_xGa_{1-x}$As cladding matrix, the molar concentration of indium (i.e., x) within this cladding matrix layer may be from about 0.55 to about 0.80, optionally from about 0.65 to about 0.75, optionally from about 0.66 to about 0.72, and optionally from about 0.67 to about 0.70.

In one or more embodiments, the $In_xGa_{1-x}$As cladding matrix is located on an indium phosphorous arsenide ($InP_{1-y}As_y$) layer that is lattice matched to the $In_xGa_{1-x}$As cladding matrix. In one or more embodiments, the $InP_{1-y}As_y$ layer onto which the $In_xGa_{1-x}$As cladding is deposited is a one of a plurality of graded (continuous or discrete) $InP_{1-y}As_y$ layers that exist between the $In_xGa_{1-x}$As cladding and the substrate onto which the semiconductor is supported. In one or more embodiments, the substrate comprises an indium phosphide (InP) wafer. The semiconductor may also include one or more other layers, such as $In_xGa_{1-x}$As layers, positioned between the $In_xGa_{1-x}$As cladding and the substrate.

One embodiment is shown in FIG. 1. FIG. 1, as well as the other figures, are schematic representations and are not drawn to scale with respect to the thickness of each layer or component, or with respect to the relative thickness or dimension between each layer comparatively.

Device 1000 includes substrate 1020, optional conduction layer 1025, buffer structure 1030, cladding layer 1040, and dot layer 1050. As those skilled in the art appreciate, some semiconductor devices operate by converting electrical current to electromagnetic radiation or electromagnetic radiation to electrical current. The ability to control electromagnetic radiation or electrical current within these devices is known in the art. This disclosure does not necessarily alter these conventional designs, many of which are known in the art of manufacturing or designing semiconductor devices.

In one embodiment, substrate 1020 comprises indium phosphide (InP). The thickness of InP substrate 1020 may be greater than 250 microns, in other embodiments greater than 300 microns, and in other embodiments greater than 350 microns. Advantageously, the thickness may be less than 700 microns, in other embodiments less than 600 microns, and in other embodiments less than 500 microns.

In one or more embodiments, the semiconductor devices envisioned may optionally include an epitaxially grown layer of indium phosphide (InP). The thickness of this epitaxially grown indium phosphide layer may be from about 10 nm to about 1 micron.

In one embodiment, optional conduction layer 1025 comprises indium gallium arsenide ($In_xGa_{1-x}$As). The molar concentration of indium (i.e., x) within this layer may be from about 0.51 to about 0.55, optionally from about 0.52 to about 0.54, and optionally from about 0.53 to about 0.535. In one or more embodiments, conduction layer 1025 is lattice matched to the InP substrate.

Conduction layer 1025 may be doped to a given value and of an appropriate thickness in order to provide sufficient electrical conductivity for a given device. In one or more embodiments, the thickness may be from about 0.05 micron to about 2 microns, optionally from about 0.1 micron to about 1 micron.

Figure 2:
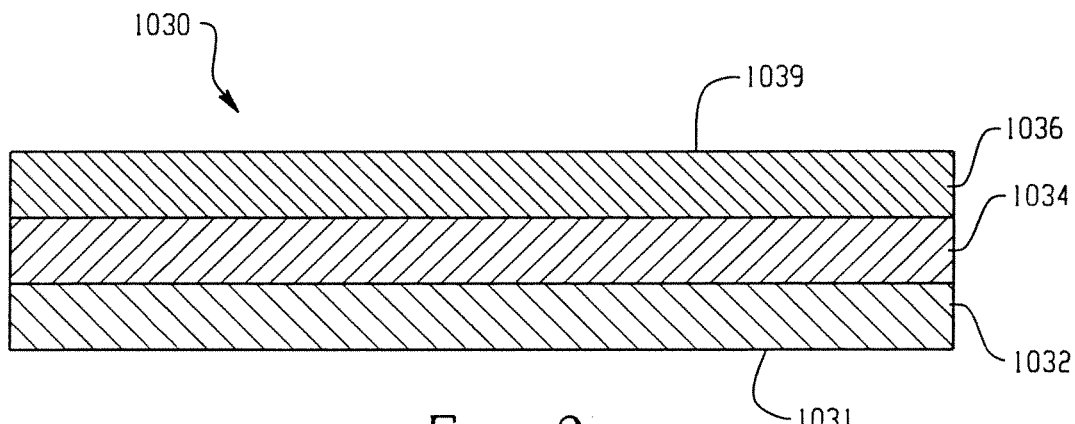
FIG. 2 is a cross-sectional view of a buffer layer of an exemplary semiconductor device implemented in one embodiment of the present invention.

In one or more embodiments, buffer layer 1030 comprises indium phosphorous arsenide ($InP_{1-y}As_y$). In certain embodiments, the buffer layer 1030 comprises at least two, optionally at least three, optionally at least four, and optionally at least five $InP_{1-y}As_y$ layers, with the lattice constant of each layer increasing as the layers are positioned further from substrate 1020. For example, and as depicted in FIG. 2, buffer structure 1030 includes first buffer layer 1032, second buffer layer 1034, and third buffer layer 1036. The bottom layer surface 1031 of buffer structure 1030 is adjacent to substrate 1020, and the top planer surface 1039 of buffer structure 1030 is adjacent to barrier layer 1040. The lattice constant of second layer 1034 is greater than first layer 1032, and the lattice constant of third layer 1036 is greater than second layer 1034.

As those skilled in the art will appreciate, the lattice constant of the individual layers of buffer structure 1030 can be increased by altering the composition of the successive layers. In one or more embodiments, the concentration of arsenic in the $InP_{1-y}As_y$ buffer layers is increased in each successive layer. For example, first buffer layer 1032 may include about 0.10 to about 0.18 molar fraction arsenic (i.e., y), second buffer layer 1034 may include about 0.22 to about 0.34 molar fraction arsenic, and third buffer layer 1036 may include about 0.34 to about 0.40 molar fraction arsenic.

In one or more embodiments, the increase in arsenic between adjacent buffer layers (e.g., between layer 1032 and layer 1034) is less than 0.17 molar fraction. It is believed that any defects formed between successive buffer layers, which may result due to the change in lattice constant resulting from the increase in the arsenic content, will not be deleterious to the semiconductor. Techniques for using critical composition grading in this fashion are known as described in U.S. Pat. No. 6,482,672, which is incorporated herein by reference.

In one or more embodiments, the thickness of first buffer layer 1032 may be from about 0.3 to about 1 micron. In one or more embodiments, the top buffer layer is generally thicker to ensure complete relaxation of the lattice structure.

In one or more embodiments, the individual buffer layer at or near the top 1039 of buffer structure 1030 (e.g., buffer layer 1036) is engineered to have a lattice constant that is from about 5.869 Å to about 5.960 Å, optionally from about 5.870 Å to about 5.932 Å.

In one or more embodiments, the individual buffer layer at or near the bottom 1031 of buffer structure 1030 (e.g., buffer layer 1032) is preferably engineered within the confines of the critical composition grading technique. In other words, inasmuch as a first buffer layer (e.g., buffer layer 1032) is deposited on and an InP wafer, the amount of arsenic present within the first buffer layer (e.g., layer 1032) is less than 17 mole fraction.

Cladding layer 1040 comprises $In_xGa_{1-x}As$. In one or more embodiments, this layer is preferably lattice matched to the in-plane lattice constant of the top buffer layer at or near the top 1039 of buffer structure 1030. The term lattice matched refers to successive layers that are characterized by a lattice constant that are within 500 parts per million (i.e., 0.005%) of one another.

In one or more embodiments, cladding layer 1040 may have a thickness that is from about 10 angstroms to about 5 microns, optionally from about 50 nm to about 1 micron, and optionally from about 100 nm to about 0.5 microns.

In one or more embodiments, quantum dot layer 1050 comprises indium arsenide (InAs). Layer 1050 preferably includes wetting layer 1051 and quantum dots 1052. The thickness of wetting layer 1051 may be one or two mono layers. In one embodiment, the thickness of dots 1052, measured from the bottom 1053 of layer 1050 and the peak of the dot 1055 may be from about 10 nm to about 200 nm, optionally from about 20 nm to about 100 nm, and optionally from about 30 nm to about 150 nm. Also, in one embodiment, the average diameter of dots 1052 may be greater than 10 nm, optionally greater than 40 nm, and optionally greater than 70 nm.

Figure 3:
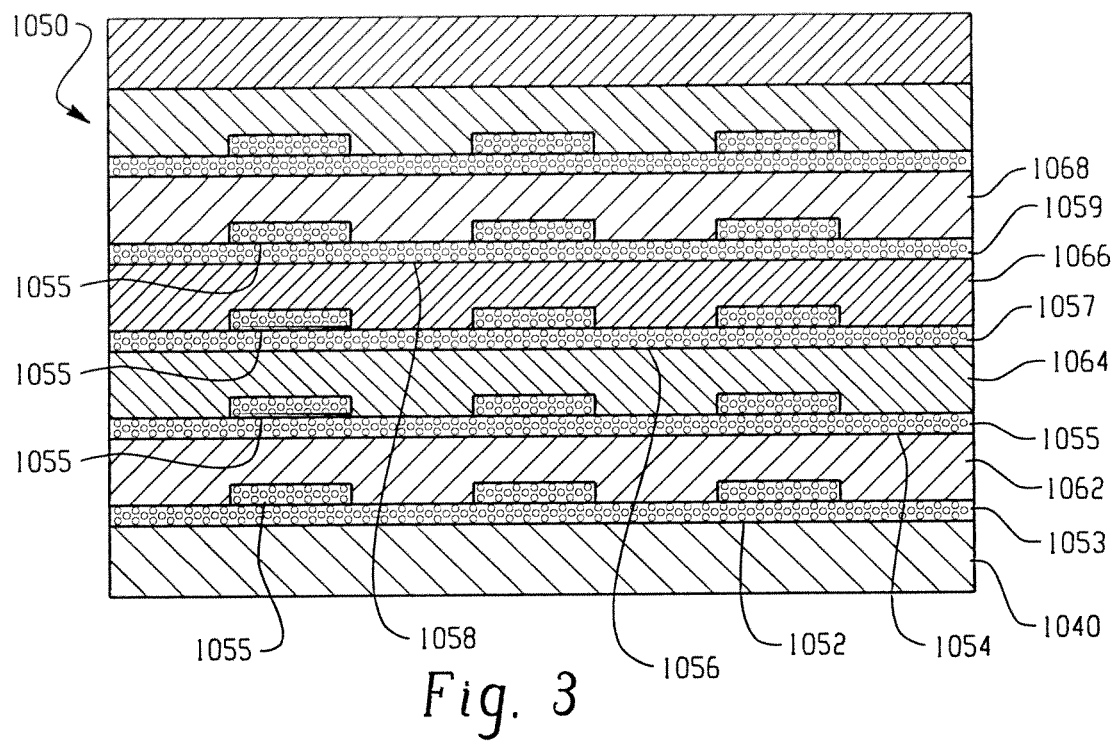
FIG. 3 is a cross-sectional view of a quantum dot layer of an exemplary semiconductor device implemented in one embodiment of the present invention.

In one or more embodiments, quantum layer 1050 includes multiple layers of dots. For example, as shown in FIG. 3, quantum dot 1050 may include first dot layer 1052, second dot layer 1054, third dot layer 1056, and fourth dot layer 1058. Each layer comprises indium arsenide InAs, and includes wetting layers 1053, 1055, 1057, and 1059, respectively. Each dot layer likewise includes dots 1055. The characteristics of the each dot layer, including the wetting layer and the dots, are substantially similar although they need not be identical.

Disposed between each of dot layers 1052, 1054, 1056, and 1058, are intermediate cladding layers 1062, 1064, 1066, and 1068, respectively. These intermediate cladding layers comprise $In_xGa_{1-x}As$. In one or more embodiments, the $In_xGa_{1-x}As$ intermediate cladding layers are substantially similar or identical to cladding layer 1040. In other words, the intermediate cladding layers are preferably lattice matched to barrier layer 1040, which is preferably lattice matched to top buffer layer 1036. In one or more embodiments, the thickness of intermediate layers 1062, 1064, 1066, and 1068 may be from about 3 nm to about 50 nm, optionally from about 5 nm to about 30 nm, and optionally from about 10 nm to about 20 nm.

As noted above, the various layers surrounding the quantum dot layer may be positively or negatively doped to manipulate current flow. Techniques for manipulating current flow within semiconductor devices is know in the art as described, for example, in U.S. Pat. Nos. 6,573,527, 6,482,672, and 6,507,042, which are incorporated herein by reference. For example, in one or more embodiments, regions or layers can be doped "p-type" by employing zinc, carbon, cadmium, beryllium, or magnesium. On the other hand, regions or layers can be doped "n-type" by employing silicon, sulfur, tellurium, selenium, germanium, or tin.

The semiconductor devices envisioned can be prepared by employing techniques that are known in the art. For example, in one or more embodiments, the various semiconductor layers can be prepared by employing organometallic vapor phase epitaxy (OMVPE). In one or more embodiments, the dot layer is prepared by employing a self-forming technique such as the Stranski-Krastanov mode (S-K mode). This technique is described in U.S. Pat. No. 6,507,042, which is incorporated herein by reference.

Figure 4:
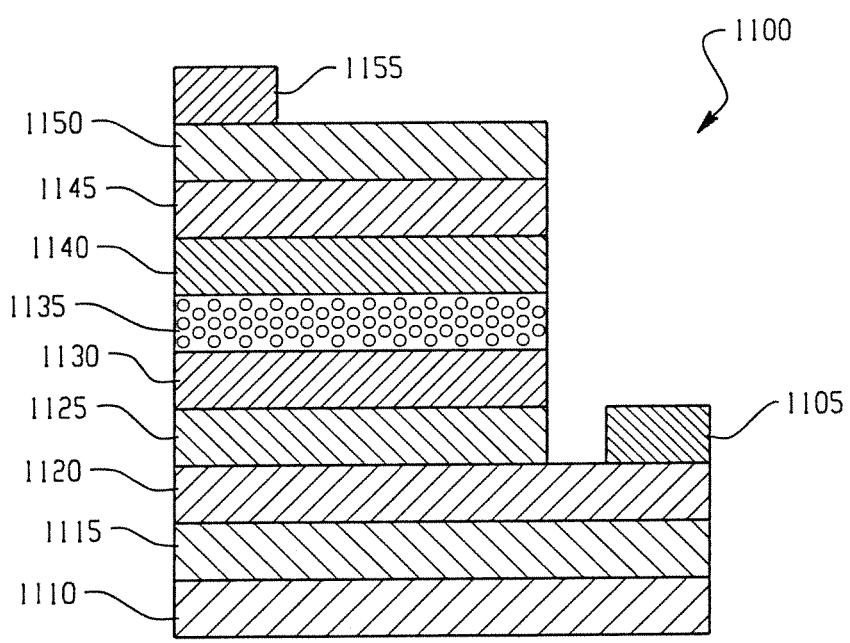
FIG. 4 is a cross-sectional view of a radiation emitting diode including a quantum dot layer implemented in one embodiment of the present invention.

One embodiment of a radiation emitting diode (RED) including a quantum dot layer is shown in FIG. 4. RED 1100 includes base contact 1105, infrared reflector 1110, semi-insulating semiconductor substrate 1115, n-type lateral conduction layer (LCL) 1120, n-type buffer layer 1125, cladding layer 1130, quantum dot layer 1135, cladding layer 1140, p-type layer 1145, p-type layer 1150, and emitter contact 1155. Base contact 1105, infrared reflector 1110, semi-insulating semiconductor substrate 1115, n-type lateral conduction layer (LCL) 1120, n-type buffer layer 1125, cladding layer 1130, quantum dot layer 1135, and cladding layer 1140 are analogous to those semiconductor layers described above.

Base contact 1105 may include numerous highly conductive materials. Exemplary materials include gold, gold-zinc alloys (especially when adjacent to p-regions), gold-germanium alloy, or gold-nickel alloys, or chromium-gold (especially when adjacent to n-regions). The thickness of base contact 1105 may be from about 0.5 to about 2.0 microns. A thin layer of titanium or chromium may be used to increase the adhesion between the gold and the dielectric material.

Infrared reflector 1110 comprises a reflective material and optionally a dielectric material. For example, a silicon oxide can be employed as the dielectric material and gold can be deposited thereon as an infrared reflective material. The thickness of reflector 1110 may be form about 0.5 to about 2 microns.

Substrate 1115 comprises InP. The thickness of substrate 1115 may be from about 300 to about 600 microns.

Lateral conduction layer 1120 comprises $In_xGa_{1-x}As$ that is lattice matched (i.e. within 500 ppm) to InP substrate 1115. Also, in one or more embodiments, layer 1120 is n-doped. The preferred dopant is silicon, and the preferred degree of doping concentration may be from about 1 to about 3 $E19/cm^3$. The thickness of lateral conduction layer 1120 may be from about 0.5 to about 2.0 microns.

Buffer layer 1125 comprises three graded layers of $InP_{1-y}As_y$ in a fashion consistent with that described above. Layer 1125 is preferably n-doped. The preferred dopant is silicon, and the doping density may be from about 0.1 to about 3 $E 9/cm^3$.

Cladding layer 1130 comprises $In_xGa_{1-x}As$ that is lattice matched to the in-plane lattice constant (i.e. within 500 ppm)

of the top of buffer layer 1125 (i.e. the third grade or sub-layer thereof). In one or more embodiments, $In_xGa_{1-x}As$ cladding layer 1130 comprises from about 0.60 to about 0.70 percent mole fraction indium. The thickness of cladding layer 1130 is about 0.1 to about 2 microns.

Quantum dot layer 1135 comprises InAs dots as described above with respect to the teachings of this invention. As with previous embodiments, the intermediate layers between each dot layer include $In_xGa_{1-x}As$ cladding similar to cladding layer 1130 (i.e., lattice matched). In one or more embodiments, the amount of indium in one or more successive intermediate cladding layers may include less indium than cladding layer 1130 or a previous or lower intermediate layer.

Cladding layer 1140 comprises $In_xGa_{1-x}As$ that is lattice matched (i.e. within 500 ppm) to the top of buffer later 1125 (i.e. the third grade or sub-layer thereof).

Confinement layer 1145 comprises $InP_{1-y}As_y$ that is lattice matched to $In_xGa_{1-x}As$ layer 1140. Also, in one or more embodiments, layer 1145 is p-doped. The preferred dopant is zinc and the doping concentration may be from about 0.1 to about 4 $E19/cm^3$. The thickness of confinement layer 1145 may be from about 20 nm to about 200 nm.

Contact layer 1150 comprises $In_xGa_{1-x}As$ that is lattice matched to confinement layer 1145. Contact layer 1150 is preferably p-doped (e.g., doped with zinc). The doping concentration may be from about 1 to about 4 $E19/cm^3$. The thickness of contact layer 1150 is from about 0.5 to about 2 microns. The contact layer 1150 may be removed from the entire surface except under layer 1155.

Emitter contact 1155 may include any highly conductive material. In one or more embodiments, the conductive material includes a gold/zinc alloy.

Figure 5:
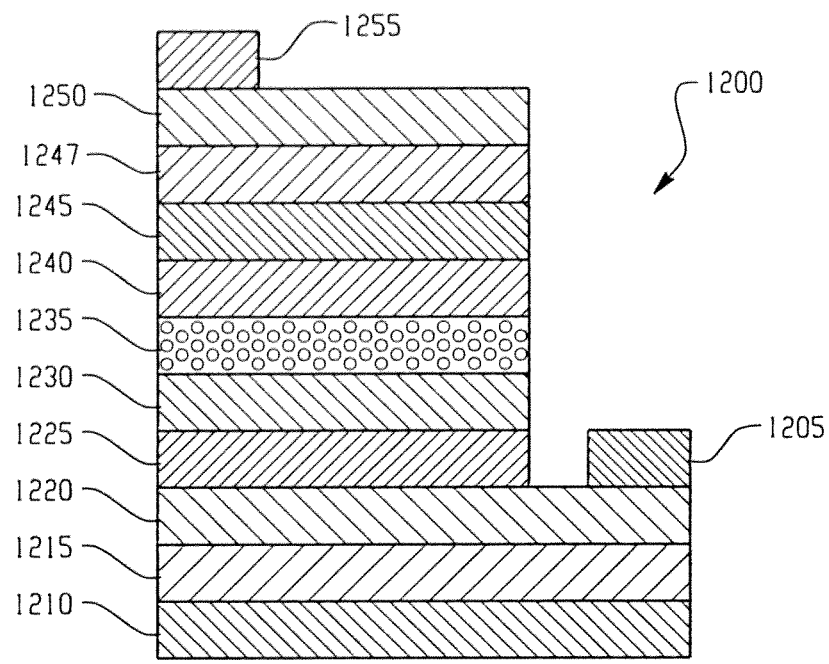
FIG. 5 is a cross-sectional view of a radiation emitting diode including a quantum dot layer implemented in one embodiment of the present invention.

Another embodiment is shown in FIG. 5. Semiconductor device 1200 is configured as a radiation emitting diode with a tunnel junction within the p region. This design advantageously provides for lower resistance contacts and lower resistance current distribution. Many aspects of semiconductor 1200 are analogous to semiconductor 1100 shown in FIG. 4. For example, contact 1205 may be analogous to contact 1105, reflector 1210 may be analogous to reflector 1110, substrate 1215 may be analogous to substrate 1115, lateral conduction layer 1220 may be analogous to conduction layer 1120, buffer layer 1225 may be analogous to buffer layer 1125, cladding layer 1230 may be analogous to cladding layer 1130, dot layer 1235 may be analogous to dot layer 1135, cladding layer 1240 may be analogous to cladding layer 1140, and confinement layer 1245 may be analogous to confinement layer 1145.

Tunnel junction layer 1247 comprises $In_xGa_{1-x}As$ that is lattice matched to confinement layer 1245. The thickness of tunnel junction layer 1247 is about 20 to about 50 nm. Tunnel junction layer 1247 is preferably p-doped (e.g., with zinc), and the doping concentration may be from about 1 to about 4 $E19/cm^3$. Tunnel junction layer 1250 comprises $In_xGa_{1-x}As$ that is lattice matched to tunnel junction 1247. The thickness of tunnel junction layer 1250 is from about 20 to about 5,000 nm. Tunnel junction layer 1250 is preferably n-doped (e.g., silicon), and the doping concentration is from about 1 to about 4 $E19/cm^3$.

Emitter contact 1255 may include a variety of conductive materials, but preferably comprises those materials that are preferred for n-regions such as chromium-gold, gold-germanium alloys, or gold-nickel alloys.

Figure 6:
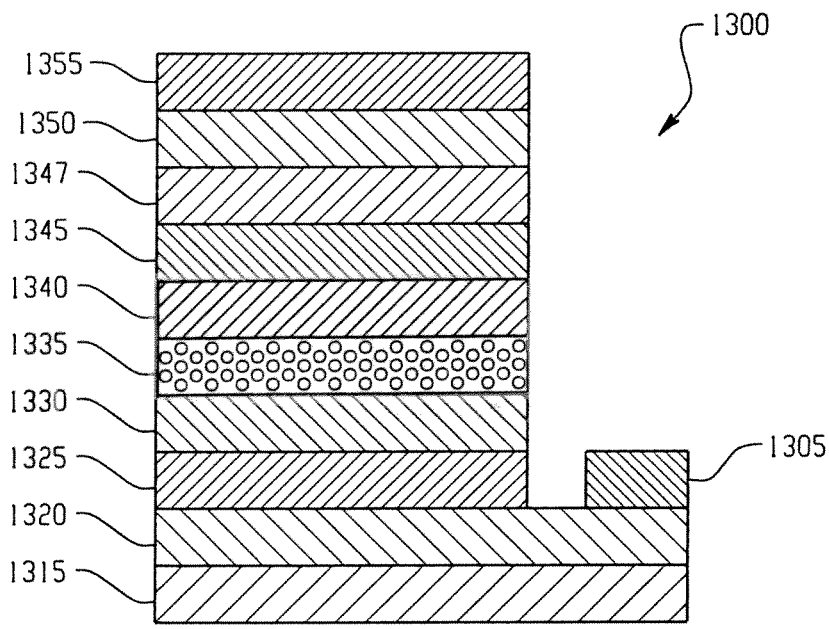
FIG. 6 is a cross-sectional view of a radiation emitting diode including a quantum dot layer implemented in to one embodiment of the present invention.

Another embodiment of an RED is shown in FIG. 6. Semiconductor device 1300 is configured as a radiation emitting diode in a similar fashion to the RED shown in FIG. 5 except that electromagnetic radiation can be emitted through the substrate of the semiconductor device due at least in part to the absence of the base reflector (e.g., the absence of a reflector such as 1210 shown in FIG. 5). Also, the semiconductor device 1300 shown in FIG. 6 includes an emitter contact/infrared reflector 1355, which is a "full contact" covering the entire surface (or substantially all of the surface) of the device.

In all other respects, device 1300 is similar to device 1200. For example, contact 1305 may be analogous to contact 1205, substrate 1315 may be analogous to substrate 1215, lateral conduction layer 1320 may be analogous to conduction layer 1220, buffer layer 1325 may be analogous to buffer layer 1225, cladding layer 1330 may be analogous to cladding layer 1230, dot layer 1335 may be analogous to dot layer 1235, cladding layer 1340 may be analogous to cladding layer 1240, and confinement layer 1345 may be analogous to confinement layer 1245, tunnel junction layer 1347 is analogous to tunnel junction layer 1247, tunnel junction layer 1350 is analogous to tunnel junction layer 1250.

Figure 7:
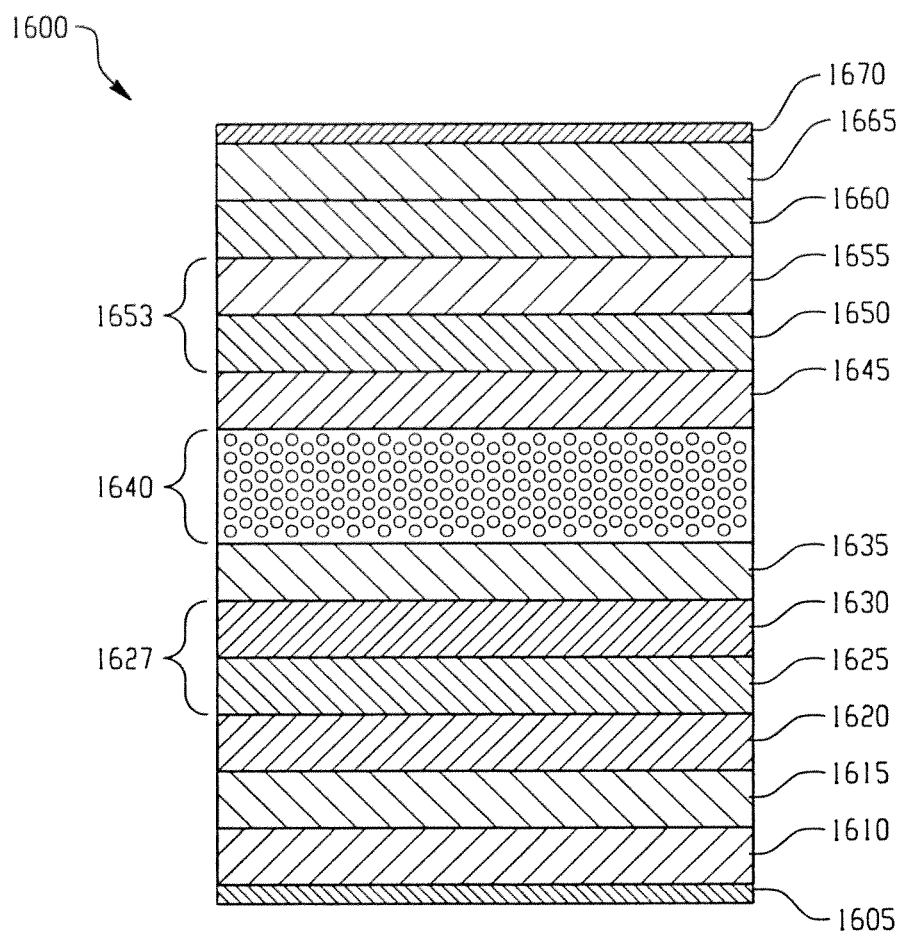
FIG. 7 is a cross-sectional view of a laser diode including a quantum dot layer implemented in one embodiment of the present invention.

The semiconductor technology envisioned may also be employed in the manufacture of laser diodes. An exemplary laser is shown in FIG. 7. Laser 1600 includes contact 1605, which can comprise any conductive material such as gold-chromium alloys. The thickness of contact layer 1605 is from about 0.5 microns to about 2.0 microns.

Substrate 1610 comprises indium phosphide that is preferably n-doped at a concentration of about 5 to about 10 $E18/cm^3$. The thickness of substrate 1610 is from about 250 to about 600 microns.

Optional epitaxial indium phosphide layer 1615 is preferably n-doped at a concentration of about 0.2 4 $E19/cm^3$ to about 1 $E19/cm^3$. The thickness of epitaxial layer 615 is from about 10 nm to about 500 nm.

Grated $InP_{1-y}As_y$ layer 1620 is analogous to the grated $InP_{1-y}As_y$ buffer shown in FIG. 2. Buffer 1620 is preferably n-doped at a concentration at about 1 to about 9 $E18/cm^3$.

Layer 1625 and 1630 form wave guide 1627. Layer 1625 comprises indium gallium arsenide phosphide ($In_{1-x}GA_xAs_zP_{1-z}$). Layer 1630 likewise comprises $In_{1-x}GA_xAs_zP_{1-z}$. Both layers 1625 and 1630 are lattice matched to the top of layer 1620. In other words, layers 1625 and 1630 comprise about 0 to about 0.3 molar fraction gallium and 0 to about 0.8 molar fraction arsenic. Layer 1625 is about 0.5 to about 2 microns thick, and is n-doped at a concentration of about 1-9 $E18/cm^3$. Layer 1630 is about 500 to about 1,500 nm, and is n-doped at a concentration of about 0.5 to 1 $E18/cm^3$.

Confinement layer 1635, dot layer 1640, and confinement layer 1645 are similar to the dot and confinement layers described above with respect to the other embodiments. For example, confinement layer 1635 is analogous to confinement layer 1040 and dot layer 1640 us analogous to dot layer 1050 shown in FIG. 3. In one or more embodiments, the number of dot layers employed within the dot region of the laser device is in excess of 5 dot layers, optionally in excess of 7 dot layers, and optionally in excess of 9 dot layers (e.g., cycles). Confinement layers 1635 and 1645 may have a thickness from about 125 to about 500 nm and are lattice matched to the wave guide. Layers 1635, 1640, and 1645 are preferably non-doped (i.e., they are intrinsic).

Layers 1650 and 1655 form wave guide 1653. In a similar fashion to layers 1625 and 1630, layers 1650 and 1655 comprise $In_{1-x}GA_xAs_zP_{1-z}$ that is lattice matched to the top of buffer 1620. Layer 1650 is about 500 to about 1,500 nm p-doped at a concentration of about 0.5 to about 1 $E18/cm^3$.

Layer 655 is about 1 to about 2 microns thick and is p-doped at a concentration of about 1 to about 9 E18/cm$^3$.

In one embodiment, layer 1660 is a buffer layer that is analogous to buffer layer 1620. That is, the molar fraction of arsenic decreases as each grade is further from the quantum dots. Layer 1660 is preferably p-doped at a concentration of 1-9 E18/cm$^3$.

Layer 1665 comprises indium phosphide (InP). The thickness of layer 1665 is about 200 to about 500 nm thick and is preferably p-doped at a concentration of about 1 to about 4 E19/cm$^3$.

Layer 1670 is a contact layer analogous to other contact layers described in previous embodiments.

In other embodiments, layers 1660, 1665, and 1670 can be analogous to other configurations described with respect to other embodiments. For example, these layers can be analogous to layers 1145, 1150, and 1155 shown in FIG. 4. Alternatively, layers analogous to 1245, 1247, 1250, and 1255 shown in FIG. 5 can be substituted for layers 1660, 1665, and 1670.

Various modifications and alterations that do not depart from the scope and spirit of these device embodiments will become apparent to those skilled in the art.

Of course, it should be appreciated that, in one form, the invention herein incorporates RED elements as described. However, it should be understood that various other device technologies may be employed. For example, experimental mid-IR LEDs operating in a range from 1.6 micrometers to 5.0 micrometers are known but are not commercial realities. In addition, various semiconductor lasers and laser diodes may be employed with suitable modifications. Of course, other enabling technologies may be developed for efficiently producing limited bandwidth irradiation in advantageous wavelengths.

In order to practice the invention for a particular application, it will usually require deploying many suitable devices in order to have adequate amplitude of irradiation. Again, in one form, these devices will be RED devices. In most heat applications of the invention, such devices will typically be deployed in some sort of high density x by y array or in multiple x by y arrays, some of which may take the form of a customized arrangement of individual RED devices. The arrays can range from single devices to more typically hundreds, thousands, or unlimited number arrays of devices depending on the types and sizes of devices used, the output required, and the wavelengths needed for a particular implementation of the invention. The RED devices will usually be mounted on circuit boards which have at least a heat dissipation capability, if not special heat removal accommodations. Often the RED devices will be mounted on such circuit boards in a very high density/close proximity deployment. It is possible to take advantage of recent innovations in die mounting and circuit board construction to maximize density where desirable for high-powered applications. For example, such techniques as used with flip chips are advantageous for such purposes. Although the efficiency of the RED devices is good for this unique class of diode device, the majority of the electrical energy input is converted directly into localized heat. This waste heat must be conducted away from the semi-conductor junction to prevent overheating and burning out the individual devices. For the highest density arrays, they may likely use flip-chip and chip-on-board packaging technology with active and/or passive cooling. Multiple circuit boards will often be used for practicality and positioning flexibility. The x by y arrays may also comprise a mix of RED devices which represent at least two different selected wavelengths of infrared radiation in a range from, for example, 1 micrometer to 5 micrometers.

For most applications, the RED devices will be deployed advantageously in variously sized arrays, some of which may be three dimensional or non-planar in nature for better irradiation of certain types of targets. This is true for at least the following reasons:

1. To provide sufficient output power by combining the output of the multiple devices.
2. To provide for enough 'spread' of output over a larger surface than a single device could properly irradiate.
3. To provide the functionality that the programmability of an array of RED devices can bring to an application.
4. To allow mixing into the array devices that are tuned to different specified wavelengths for many functional reasons described in this document.
5. To facilitate matching the 'geometry' of the output to the particular application requirement.
6. To facilitate matching the devices mounting location, radiating angles and economics to the application requirements.
7. To facilitate the synchronization of the output to a moving target or for other 'output motion'.
8. To accommodate driving groups of devices with common control circuitry.
9. To accommodate multi-stage heating techniques.

Because of the typical end uses of diodes, they have been manufactured in a manner that minimizes cost by reducing the size of the junction. It therefore requires less semiconductor wafer area which is directly correlated to cost. The end use of RED devices will often require substantial radiated energy output in the form of more photons. It has been theorized that REDs could be manufactured with creative ways of forming a large photon producing footprint junction area. By so doing, it would be possible to produce RED devices capable of sustaining dramatically higher mid-infrared, radiant output. If such devices are available, then the absolute number of RED devices needed to practice this invention could be reduced. It would not necessarily be desirable or practical, however, given the high power outputs associated with the many applications of this invention, that the number of devices would be reduced to a single device. The invention can be practiced with a single device for lower powered applications, single wavelength applications, or, if the RED devices can be manufactured with sufficient output capability.

Similarly, it is possible to manufacture the RED device arrays as integrated circuits. In such an implementation the REDs would be arrayed within the confines of a single piece of silicon or other suitable substrate but with multiple junctions that function as the photon conversion irradiation sites on the chip. They could be similar to other integrated circuit packages which use ball grid arrays for electrical connectivity. Such device packages could then be used as the array, facilitating the desired electrical connectivity for connection to and control by the control system. Again, a design parameter is the control of the junction temperature which should not be allowed to reach approximately 100° to 105° C., with current chemistries, before damage begins to occur. It is anticipated that future chemistry compounds may have increased heat tolerance but heat must always be kept below the critical damage range of the device employed. They could further be deployed either on circuit boards individually or in multiples or they could be arrayed as a higher level array of devices as dictated by the application and the economics.

In designing the best configuration for deploying RED devices into irradiation arrays, regardless of the form factor of the devices, the designer must consider the whole range of variables. Some of the variables to be considered in view of the targeted application include packaging, ease of deployment, costs, electronic connectivity, control to programmability considerations, cooling, environment of deployment, power routing, power supply, string voltage, string geometry, irradiation requirements, safety and many others that one skilled in the appropriate arts will understand.

All raw materials used to manufacture products have associated with them particular absorption and transmission characteristics at various wavelengths within the electromagnetic spectrum. Each material also has characteristic infrared reflection and emission properties but we will not spend any time discussing these because the practicing of this invention is more driven by the absorption/transmission properties. The percent of absorption at any given wavelength can be measured and charted for any specific material. It can then be shown graphically over a wide range of wavelengths as will be explained and exampled in more detail later in this document. Because each type of material has characteristic absorption or transmission properties at different wavelengths, for best thermal process optimization it is very valuable to know these material properties. It should be recognized that if a certain material is highly transmissive in a certain range of wavelengths then it would be very inefficient to try to heat that material in that wavelength range. Conversely, if the material is too absorptive at a certain wavelength, then the application of radiant heating will result in surface heating of the material. For materials that are inefficient heat conductors, this is not usually an optimum way to heat evenly through the material.

The fact that various materials have specific absorption or transmission characteristics at various wavelengths has been well known in the art for many years. Because, however, high-powered infrared sources were not available that could be specified at particular wavelengths, or combinations of wavelengths, it has not historically been possible to fully optimize many of the existing heating or processing operations. Since it was not practical to deliver specific wavelengths of infrared radiation to a product, many manufacturers are not aware of the wavelengths at which their particular product is most desirously heated or processed.

Figure 9:
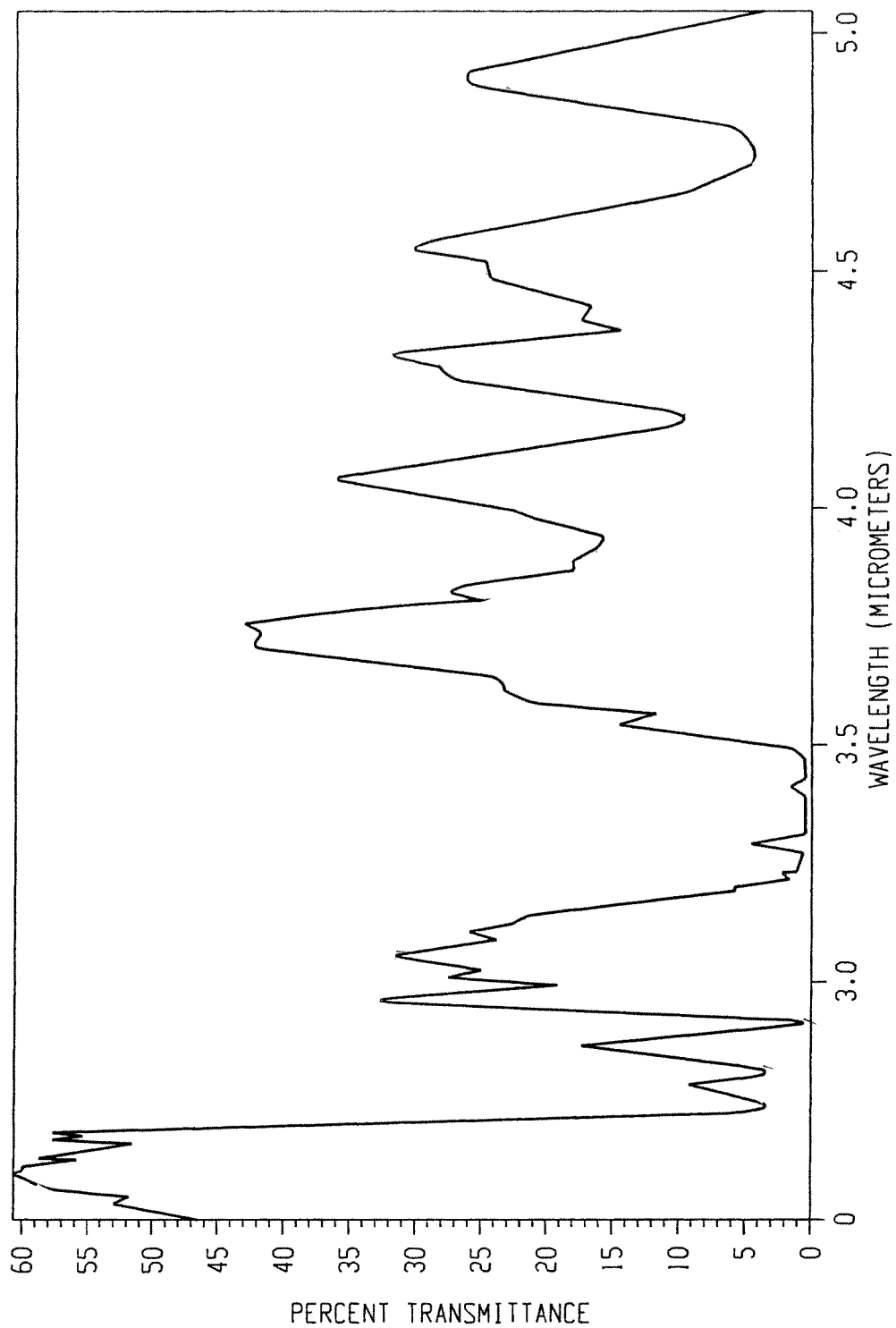
FIGS. 9 and 10 show the relative percentage of infrared energy transmitted through a 10 mil thick section of PET as a function of wavelength.
Figure 10:
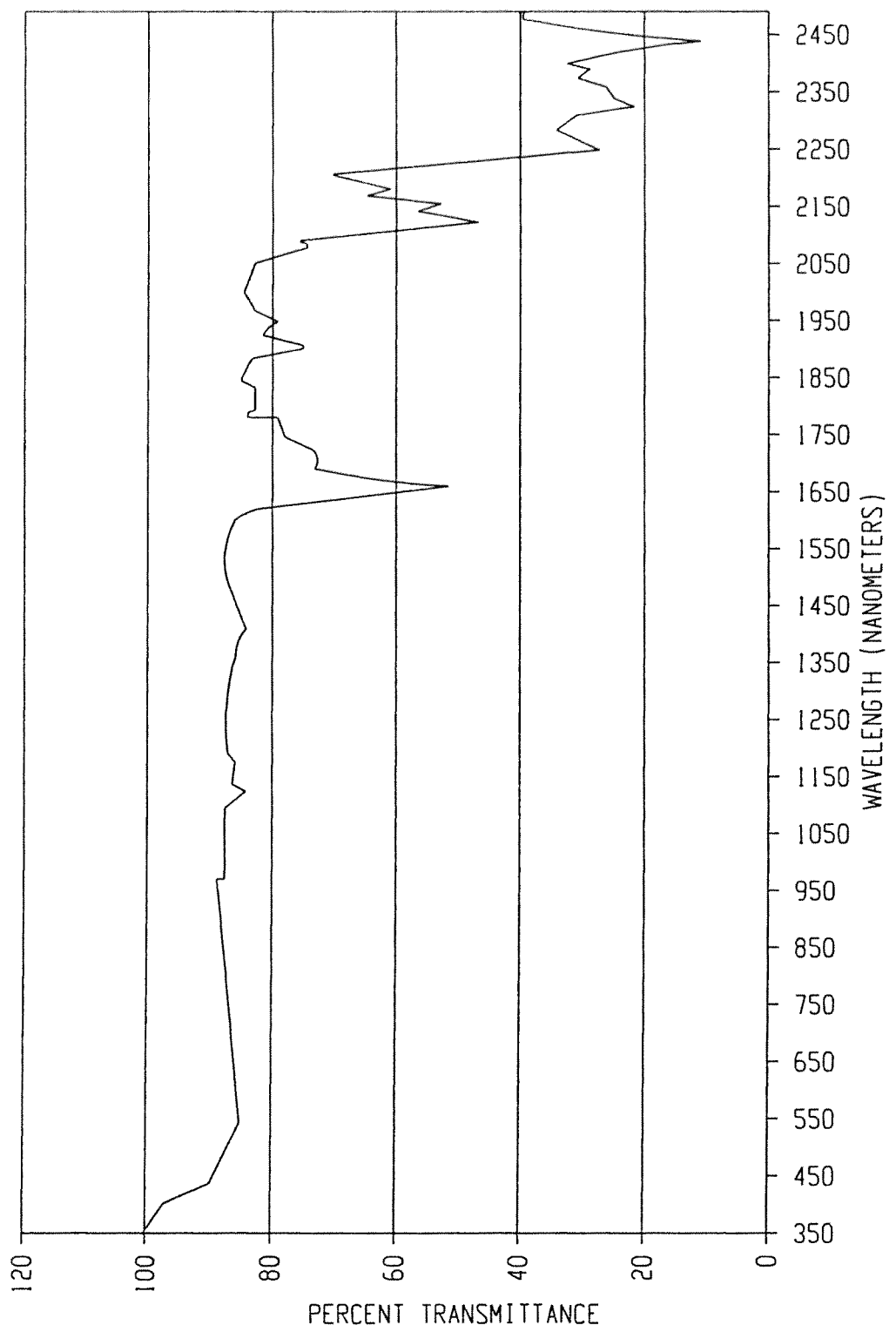

This is illustrated this with an example in the plastics industry. Referring to FIGS. 9 and 10, by examining the transmission curve of Polyethylene terephthalate (PET resin material, as it is known in the industry), out of which plastic beverage containers are stretch blow molded, it can be observed that the PET material is highly absorptive in the long wavelength region and is highly transmissive in the visible and near-infrared wavelength regions. Its transmission varies dramatically between 1 micrometers and 5 micrometers. Its transmission not only varies dramatically in that range but it varies frequently and abruptly and often very substantially sometimes within 0.1 micrometers.

For example, at 2.9 micrometers PET has a very strong absorption. This means that if infrared radiation was introduced to PET at 2.9 micrometers, it would nearly all be absorbed right at the surface or outer skin of the material. If it were desirable to heat only the outer surface of the material, then this wavelength could be used. Since PET is a very poor conductor of heat (has a low coefficient of thermal conductivity) and since it is more desirable in stretch blow molding operations to heat the PET material deeply from within and evenly all the way through its volume, this is, in practice, a bad wavelength at which to heat PET properly.

Looking at another condition, at 1.0 micrometer (1000 nanometers) PET material is highly transmissive. This means that a high percentage of the radiation at this wavelength that impacts the surface of the PET, will be transmitted through the PET and will exit without imparting any preferential heating, hence be largely wasted. It is important to note that the transmission of electromagnetic energy decreases exponentially as a function of thickness for all dielectric materials, so the material thickness has a substantial impact on the choice for the optimal wavelength for a given material.

It should be understood that while PET thermoplastic material has been used here as an example, the principles hold true for a very wide range of different types of materials used in different industries and for different types of processes. As a very different example, a glue or adhesive lamination system is illustrative. In this example, suppose that the parent material that is to be glued is very transmissive at a chosen infrared wavelength. The heat-cured glue that is to be employed might be very absorptive at that same wavelength. By irradiating the glue/laminate sandwich at this specific advantageous wavelength, the process is further optimized because the glue, and not the adjacent parent material, is heated. By selectively choosing these wavelength interplays, optimum points are found within various widely diverse kinds of processing or heating applications within industry.

Historically, the ability to produce relatively high infrared radiation densities at specific wavelengths has simply not been available to industry. Therefore, since this type of heating or processing optimization has not been available, it has not been contemplated by most manufacturers. It is anticipated that the availability of such wavelength specific infrared radiant power will open entirely new methodologies and processes. The subject invention will make such new processes practical and will provide an implementation technology that has far reaching flexibility for a wide range of applications. While it is anticipated that the first utilizations of the subject invention will be in industry, it is also recognized that there will be many applications in commercial, medical, consumer, and other areas as well.

It is anticipated that the invention will be very useful as an alternative to broadband quartz infrared heating bulbs, or other conventional heating devices, that are currently in wide usage. Such quartz bulbs are used for a range of things including heating sheets of plastic material in preparation for thermo-forming operations. Not only can the subject invention be utilized as an alternative to the existing functionality of quartz infrared lamps or other conventional heating devices, but it can be envisaged to add substantial additional functionality.

The present invention, by contrast, can either generate radiant energy in a continuously energized or alternately a pulsed mode. Because the basic REDs devices of the subject invention have an extremely fast response time which measures in microseconds, it can be more energy efficient to turn the energy on when it is needed or when a target component is within the targeted area and then turn it off when the component is no longer in the targeted area.

The added functionality of being able to pulse energize the infrared source can lead to a considerable improvement in overall energy efficiency of many radiant heating applications. For example, by suitably modulating the energized time of either individual or arrays of the infrared radiation emitting devices (REDs), it is possible to track individual targets as they move past the large infrared array source. In other words, the infrared emitting devices that are nearest the target device would be the ones that would be energized. As the target component or region moves onward, the "energizing wave" could be passed down the array.

Figure 17:
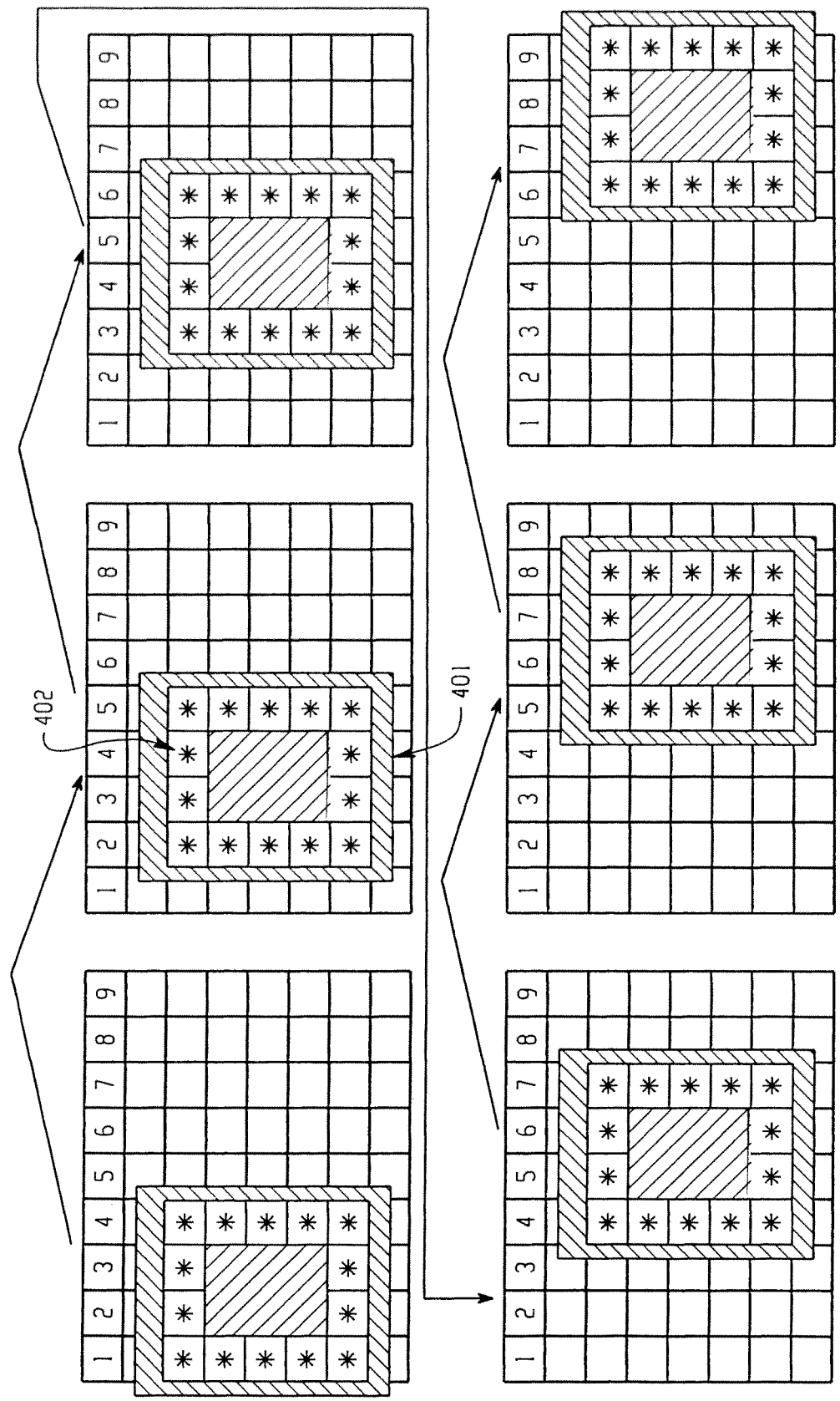
FIG. 17 shows RED heater elements being advantageously applied to a dynamically transported part.

In the case of heating material which will be thermoformed, it could be desirable to apply more heat input into areas which will get more severely formed as compared to areas which will be more modestly formed or not formed at all. It is possible, by correctly designing the configuration of infrared emitter arrays, to not only not have all the devices energized simultaneously but it is possible to energize them very strategically to correspond to the shape of the area to be heated. For continuously moving production lines, for example, it might be most desirable to program a specially shaped area of desired heat profile that can be programmably moved in synchronous motion with the target region to be heated. Consider a picture frame shaped area requiring heating as shown in FIG. 17. In this case, it would be possible to have a similar picture frame shaped array of devices (402) at desired radiant intensity that would programmably move down the array, synchronized with the movement of the target thermoforming sheet (401). By using an encoder to track the movement of a product such as the (401) thermoforming sheet, well known electronics synchronization techniques can be used to turn on the right devices at the desired intensity according to a programmable controller or computer's instructions. The devices within the arrays could be turned on by the control system for their desired output intensity in either a "continuous" mode or a "pulsed" mode. Either mode could modulate the intensity as a function of time to the most desirable output condition. This control can be of groups of devices or down to individual RED devices. For a particular application, there may not be a need, to have granular control down to the individual RED devices. In these instances the RED devices can be wired in strings of most desired geometry. These strings or groups of strings may then be programmably controlled as the application requirements dictate. Practicality will sometimes dictate that the RED devices are driven in groups or strings to facilitate voltages that are most convenient and to reduce the cost of individual device control.

The strings or arrays of REDs may be controlled by simply supplying current in an open loop configuration or more sophisticated control may be employed. The fact intensive evaluation of any specific application will dictate the amount and level of infrared radiant control that is appropriate. To the extent that complex or precise control is dictated, the control circuitry could continuously monitor and modulate the input current, voltage, or the specific output. The monitoring for most desirable radiant output or result could be implemented by directly measuring the output of the infrared array or, alternatively, some parameter associated with the target object of the infrared radiation. This could be performed by a continuum of different technologies from incorporating simple thermocouples or pyrometers up to much more sophisticated technologies that could take the form of, for example, infrared cameras. One skilled in the art will be able to recommend a particular closed loop monitoring technique that is economically sensible and justifiable for a particular application of the invention.

Both direct and indirect methods of monitoring can be incorporated. For example, if a particular material is being heated for the purpose of reaching a formable temperature range, it may be desirable to measure the force needed to form the material and use that data as at least a portion of the feedback for modulation of the infrared radiation arrays. Many other direct or indirect feedback means are possible to facilitate optimization and control of the output of the subject invention.

It should be clearly understood that the shapes, intensities, and energizing time of the present invention radiant heat source, as described herein, is highly programmable and lends itself to a very high level of programmable customization. Often in industry, custom shapes or configurations of heat sources are designed and built for a specific component to direct the heating to the correct locations on the component. With the flexible programmability of the subject invention it is possible for a single programmable heating panel to serve as a flexible replacement to an almost infinite number of custom-built panels. Industry is replete with a wide variety of infrared ovens and processing systems. Such ovens are used for curing paints, coatings, slurries of various sorts and types, and many other purposes. They also can be used in a wide variety of different lamination lines for heat fusing materials together or for curing glues, adhesives, surface treatments, coatings, or various layers that might be added to the lamination 'sandwich'.

Other ovens may be used for a wide variety of drying applications. For example, in the two-piece beverage can industry it is common to spray a coating into the interior of the beverage can and then transport them continuously by conveyor "in mass" through a long curing oven. The uncured interior coating has the appearance of white paint upon application but after curing becomes nearly clear. In these various drying and curing applications with the current invention, it would be possible to choose a wavelength or combination of wavelengths that are the most readily and appropriately absorbed by the material that needs to be dried, treated, or cured. In some applications the wavelengths that are not present may be more important to an improved process than the ones that are present. The undesirable wavelengths may adversely affect the materials by drying, heating, changing grain structure or many other deleterious results which in a more optimum process could be avoided with the subject invention.

Often it is desirable to raise the temperature of a target material to be cured or dried without substantially affecting the substrate or parent material. It may well be that the parent material can be damaged by such processing. It is more desirable to not induce heat into it while still inducing heat into the target material. The subject invention facilitates this type of selective heating.

To review another application area for the invention, the medical industry has been experimenting with a wide range of visible light and near-infrared radiant treatments. It has been theorized that certain wavelengths of electromagnetic energy stimulate and promote healing. It has also been postulated that irradiation with certain wavelengths can stimulate the production of enzymes, hormones, antibodies, and other chemicals within the body as well as to stimulate activity in sluggish organs. It is beyond the scope of this patent to examine any of the specific details or treatment methodologies or the merit of such postulations. The subject invention however, can provide a solid state, wavelength selectable, and programmable mid-infrared radiation source that can facilitate a wide range of such medical treatment modalities.

It is historically true however that the medical industry has not had a practical methodology for producing high-powered, wavelength specific irradiation in the mid-IR wavelength bands. The present invention would allow for such narrow band wavelength specific infrared irradiation and it could do so in a slim, light weight, safe and convenient form factor that would be easily used for medical applications.

For medical treatment there are some very important advantages to being able to select the specific wavelength or combination of wavelengths that are used for irradiation. Just as in industrial manufacturing materials, organic materials also have characteristic transmission/absorption spectral-curves. Animal, plant, or human tissue exhibits specific absorption/transmissive windows which can be exploited to great advantage.

A very high percentage of the human body is composed elementally of water, therefore it is likely that the transmission/absorption curves for water are a good starting point for a rough approximation for much human tissue. Through extensive research it is possible to develop precise curves for all types of tissue in humans, animals, and plants. It is also possible to develop the relationship between various kinds of healing or stimulation that might be sought from organs or tissue and relate that to the transmission/absorption curves. By carefully selecting the wavelength or combination of wavelengths, it would be possible to develop treatment regimens which could have a positive effect with a wide range of maladies and ailments.

Some tissues or organs that it would be desirable to treat are very near the surface while others lie deep within the body. Due to the absorption characteristics of human tissue, it might not be possible to reach such deep areas with non-invasive techniques. It may be necessary to use some form of invasive technique in order to get the irradiation sources near the target tissue. It is possible to design the irradiation arrays of the present invention so that they are of the appropriate size and/or shape to be used in a wide range of invasive or non-invasive treatments. While the treatment techniques, modalities and configurations are beyond the scope of this discussion; the invention is the first of its kind available to make solid state, wavelength selective irradiation available in the middle-infrared wavelength bands. It can be configured for a wide range of modalities and treatment types. Due to its highly flexible form factor and programmable nature it is capable of being configured for a particular body size and weight to produce the appropriate angles, intensities, and wavelengths for custom treatment.

Infrared radiation is being utilized for an increasing number of medical applications from hemorrhoid treatments to dermatology. One example of infrared treatment that is currently performed with broadband infrared sources is called infrared coagulation treatment. Additionally, diabetic peripheral neuropathy is sometimes treated with infrared lamp treatments. Tennis elbow and other similar ailments are often currently treated with broadband infrared lamps as well. The incorporation of the present invention's ability to generate specific wavelengths of radiation as well as its ability to generate pulsed irradiation may provide substantial improvement in these treatments. It also may provide for better patient toleration and comfort. The invention also facilitates manufacturing a medical device that could be powered with inherently safe voltages.

The pulsing of the irradiation energy may prove to be a key aspect associated with many medical treatment applications. Continuous irradiation may cause tissue overheating while a pulsed irradiation may prove to provide enough stimulation without the deleterious effect of overheating, discomfort, or tissue damage. The very fact that the devices/arrays can be pulsed at extremely high rates with turn-on times measured in microseconds or faster provides another useful property. It is anticipated that very high intensity pulses of radiation may be tolerated without damage to the arrays if they are activated for very short duty cycles, since the semi-conductor junction overheat would not have time to occur with such short pulse times. This would allow greater summed instantaneous intensity which could facilitate penetration through more tissue.

The frequency at which the pulsing occurs may also prove to be important. It is known within the literature that certain frequencies of irradiation tool humans can have healing or, alternatively, deleterious effects. For example, certain amplitude modulation frequencies or combinations of frequencies of visible light can cause humans to become nauseous and yet other amplitude modulation frequencies or combinations of frequencies can cause epileptic seizures. As further medical research is done it may indeed determine that the pulsing frequency, waveform shape, or combination of frequencies along with the selected wavelength or combination of wavelengths have a very substantial effect on the success of various radiation treatments. It is very likely that many of the treatment modalities which will utilize this invention are not yet understood nor realized since the subject invention has not been available to researchers or practitioners.

Another application for the subject invention is in the preparation processing, or staging of food. Certainly a very wide range of different types of ovens and heating systems have been used in the preparation of food throughout human history. Since most of them are well known, it is beyond the scope of this patent application to describe the full range of such ovens and heating systems. With the notable exception of microwave cooking which utilizes non-infrared/non-thermal source cooking technology, virtually all other cooking technologies utilize broadband heating sources of various types. The infrared heating sources and elements that are used in such ovens are broad-band sources. They do not have the ability to produce specific wavelengths of infrared energy that might be most advantageous to the particular cooking situation or the product being cooked.

As was discussed earlier with other materials, plant and animal products have specific absorption spectral curves. These specific absorption curves relate how absorptive or transmissive a particular food product is at specific wavelengths. By selecting a particular wavelength or a few carefully selected wavelengths at which to irradiate the subject food it is possible to modify or optimize the desired cooking characteristics. The most efficient use of radiated energy can reduce the cost of heating or cooking.

For example, if it is most desirous to heat or brown the outer surface of a particular food product, the subject invention would allow for the selection of a wavelength at which that particular food product is highly absorptive. The result would be that when irradiated at the chosen wavelength the infrared energy would all be absorbed very close to the surface, thus causing the desired heating and/or browning action to take place right at the surface. Conversely, if it is desired not to overheat the surface but rather to cook the food from very deeply within it, then it is possible to choose a wavelength or combination of selected wavelengths at which the particular food is much more transmissive so that the desired cooking result can be achieved. Thus the radiant energy will be absorbed progressively as it penetrates to the desired depth.

It is important to note that for electromagnetic waves traveling through a non-metallic material, the intensity of this wave I(t) decreases as a function of travel distance t as described by the following equation:

$$I(t) = I_o(e^{-\alpha t})$$

In this equation, $I_o$ is the initial intensity of the beam and α is the specific absorption coefficient for the material. As time t increases, the intensity of the beam undergoes exponential decay which is caused by radiant energy within the original beam being absorbed by the host material. For this reason, the use of infrared radiation heating to achieve optimum cooking results entails a complex interaction between the thickness of the food items, the applied infrared radiant intensity, the irradiation wavelength, and the material absorption coefficient(s).

By mixing RED elements that irradiate at different wavelengths, it is possible to further optimize a cooking result. Within such a multi-wavelength array, one element type would be chosen at a wavelength wherein the absorption of radiant energy is low, thus allowing deep-heat penetration to occur. A second element type would be chosen wherein the absorption of radiant energy is high thus facilitating surface heating to occur. Completing the array, a third RED element type could be conceived to be chosen at a wavelength intermediate to these two extremes in absorption. By controlling the relative radiant output level of the 3 types of RED emitters contained in such an array, it would be possible to optimize the important properties of prepared food items.

By connecting color, temperature, and potentially visual sensors to the control system it is possible to close the loop and further optimize the desired cooking results. Under such circumstances, it may be possible to check the exact parameter which might be in question and allow the control system to respond by sending irradiation at the appropriate wavelength, intensity, and direction that would be most desirable. By utilizing and integrating a vision sensor, it would be possible to actually view the locations and sizes of the food products that are to be cooked and then optimize the ovens' output accordingly as has been described above. When used in combination with a moisture sensor, it would be possible to respond with the combination that would maintain the desired moisture content. It is, therefore, possible to understand how the subject invention, in combination with the appropriate sensors, and controller "intelligence" can truly facilitate the smart oven of the future. It is, of course, possible to combine the present invention with conventional cooking technologies, including convection ovens and microwave oven capability to get the best blend of each of these technology offerings. The smart control system could be designed to best optimize both the present invention technology in combination with the conventional cooking technologies.

It is also possible, by selecting wavelengths that would be absorbed by one food and not as highly absorbed by a second food, to be very selective as to the amount of heating that takes place in a mixed plate of food. Thus it can be understood that by changing the combinations and permutations and intensities of various wavelengths that are selectable one could achieve a wide range of specifically engineered cooking results.

With any of the applications of the subject invention, it is possible to use various lensing or beam guiding devices to achieve the desired directionality of the irradiation energy. This can take the form of a range of different implementations—from individually lensed RED devices to micro lens arrays mounted proximate to the devices. The chosen beam guiding devices must be chosen appropriately to function at the wavelength of radiation that is being guided or directed. By utilizing well understood techniques for diffraction, refraction, and reflection, it is possible to direct energy from different portions of an array of RED devices in desired directions. By programmably controlling the particular devices that are turned on, and by modulating their intensities, it is possible to achieve a wide range of irradiation selectivity. By choosing steady state or pulsing mode and by further programming which devices are pulsed at what time, it is possible to raise the functionality even further.

Though this disclosure discusses the application of radiant energy primarily within the 1.0 to 3.5 micrometers range, it should be obvious to anyone skilled in the art that similar material heating effects can be achieved at other operational wavelengths, including longer wavelengths in the infrared or shorter wavelengths down through the visible region. The spirit of the disclosed invention includes the application of direct electron-to-photon solid-state emitters for the purposes of radiant heating wherein the emitters are conceivably operational from the visible through the far infrared. It may be desirable to, for certain types of applications, to combine other wavelength selectable devices into the invention which irradiate at other wavelengths outside the mid-infrared range.

Figure 8:
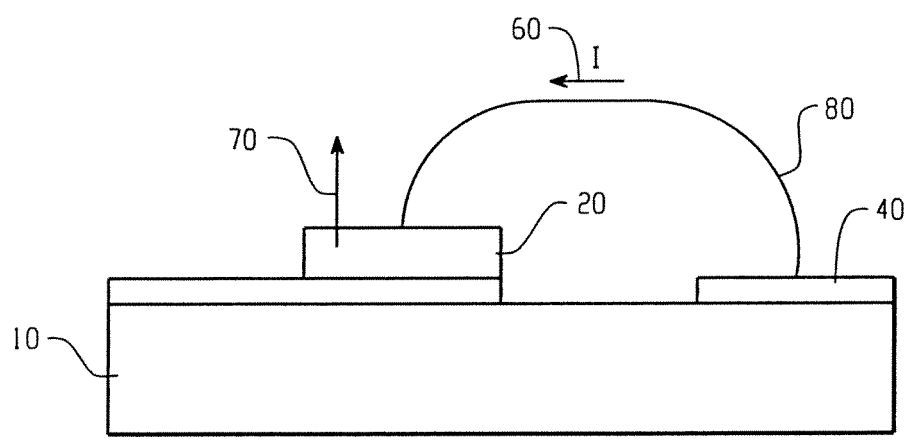
FIG. 8 shows a graphical representation of a single RED semiconductor device.

FIG. 8 gives a graphical indication of a single RED component 10. The RED 10 comprises a stack 20. The stack 20 may take a variety of configurations, such as the stacks of semiconductor layers and the like illustrated in connection with FIGS. 1-7. In at least one form, the contact 40 (corresponding, for example, to contacts 1105, 1205 and 1305) of the RED 10 is made to the stack 20 through wire 80. When a current 60 is made to flow through the bonding wire 80 and the stack 20, photons 70 are emitted that possess a characteristic energy or wavelength consistent with the configuration of the stack 20.

Because many of the semi-conductor lessons learned in manufacturing LEDs may apply to REDs, it is useful to mention a parallel that may help the evolution of the new RED devices. Drastic improvements in the energy conversion efficiency (optical energy out/electrical energy in) of LEDs have occurred over the years dating to their introduction into the general marketplace. Energy conversion efficiencies above 10% have been achieved in commercially available LEDs that operate in the visible light and near IR portion of the spectrum. This invention contemplates the use of the new REDs operating somewhere within the 1 micrometer to 3.5 micrometer range as the primary infrared heating elements within various heating systems. This application describes a specific implementation in blow molding systems.

FIGS. 9 and 10 show the relative percentage of IR energy transmitted within a 10 mil thick section of PET as a function of wavelength. Within the quartz transmission range (up to 3.5 micrometer), the presence of strong absorption bands (wavelength bands of little or no transmission) are evident at several wavelengths including 2.3 micrometer, 2.8 micrometer, and 3.4 micrometer. The basic concept associated with the subject invention is the use of RED elements designed and chosen to operate at a selected wavelength(s) within the 1 micrometer to 3.5 micrometer range as the fundamental heating elements within the thermal conditioning section of blow molding machines.

Figure 11A:
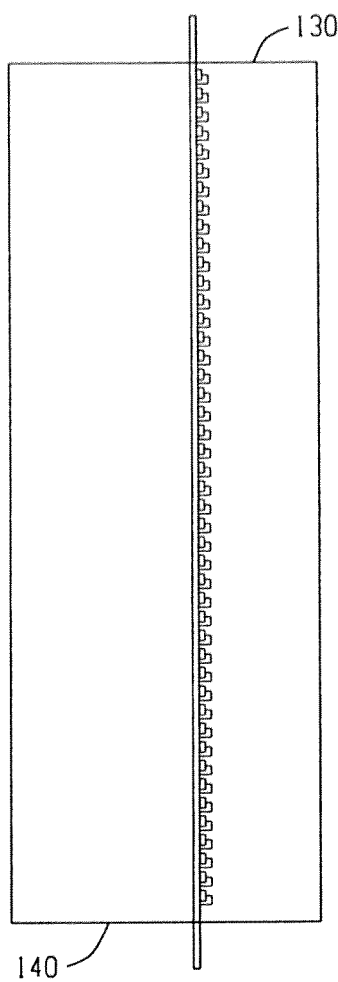
FIGS. 11a, 11b, and 11c show a typical ensemble of individual RED emitters packaged together into a RED heater element.
Figure 11B:
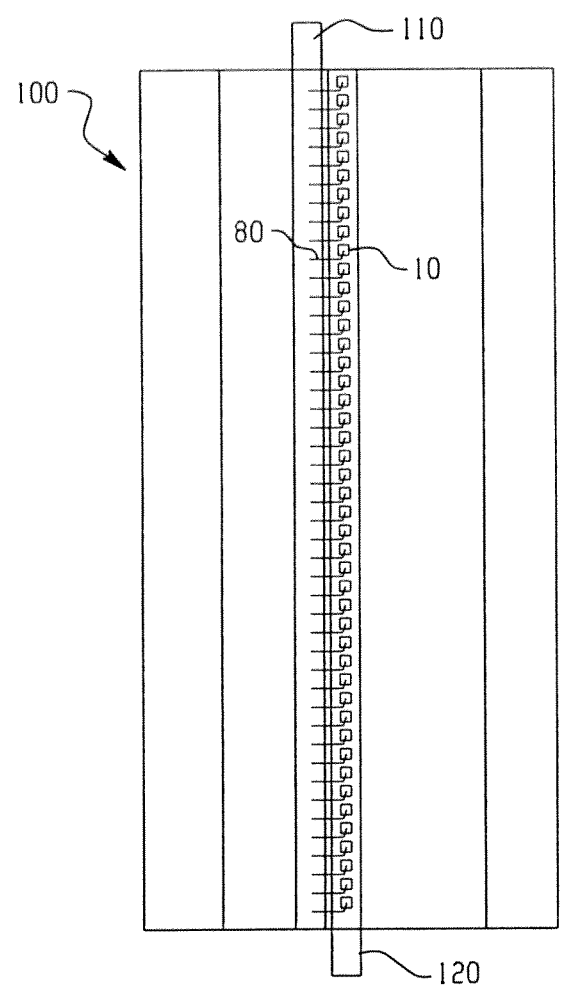
Figure 11C:
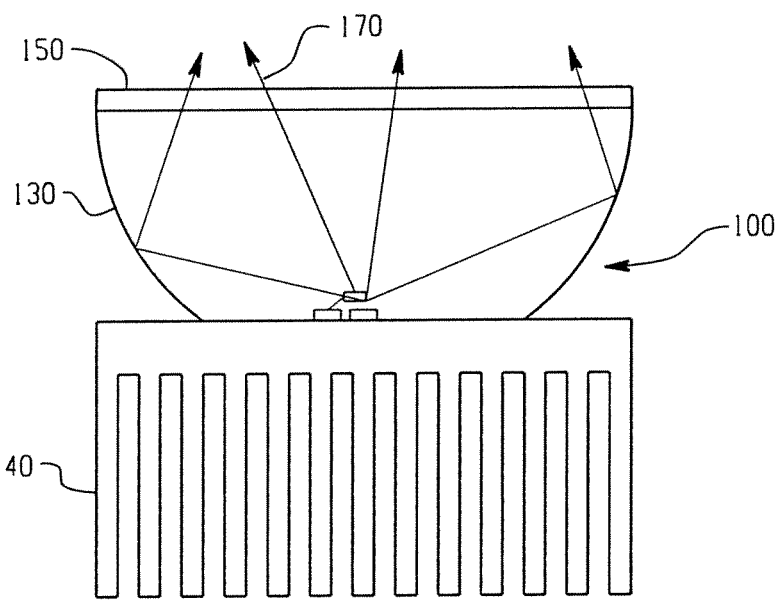

FIGS. 11*a*, 11*b*, and 11*c* show an example ensemble of individual RED emitters 10 packaged together into a suitable RED heater element 100. In this embodiment of the invention, the REDs 10 are physically mounted so that N-doped regions are directly attached to a cathode bus 120. The cathode bus 120 is ideally fabricated out of a material such as copper, or gold, which is both a good conductor of electricity as well as heat. The corresponding regions of the REDs 10 are connected via bond wires 80 to the anode bus 110. Ideally, the anode bus would have the same thermal and electrical properties as the cathode bus. Input voltage is externally generated across the 2 bus bars causing a current (I) to flow within the REDs 10 resulting in the emission of IR photons or radiant energy, such as that shown at 170. A reflector 130 is used in the preferred embodiment to direct the radiant energy into a preferred direction away from the RED heater element 100. The small physical extent of the REDs 10 make it possible to more easily direct the radiant energy 170 that is emitted into a preferred direction. This statement being comparatively applied to the case of a much larger coiled filament; such a relationship between the physical size of an emitter and the ability to direct the resultant radiant flux using traditional lensing means being well known in the art.

A heat sink 140 is used to conduct waste heat generated in the process of creating IR radiant energy 170 away from the RED heater element 100. The heat sink 140 could be implemented using various means known within industry. These means include passive heat sinking, active heat sinking using convection air cooling, and active heat sinking using water or liquid cooling. The liquid cooling through, for example, a liquid jacket has the advantage of being able to conduct away the substantial amount of heat that is generated from the quantity of electrical energy that was not converted to radiant photons. Through the liquid media, this heat can be conducted to an outdoor location or to another area where heat is needed. If the heat is conducted out of the factory or to another location then air conditioning/cooling energy could be substantially reduced.

Additionally, a bulb 150 is optimally used in this embodiment of the invention. The primary function of the bulb 150 as applied here is to protect the REDs 10 and bonding wires 80 from being damaged. The bulb 150 is preferably constructed out of quartz due to its transmission range that extends from the visible through 3.5 micrometer. However, other optical materials including glass having a transmission range extending beyond the wavelength of operation of the REDs 10 could also be used.

Figure 12A:
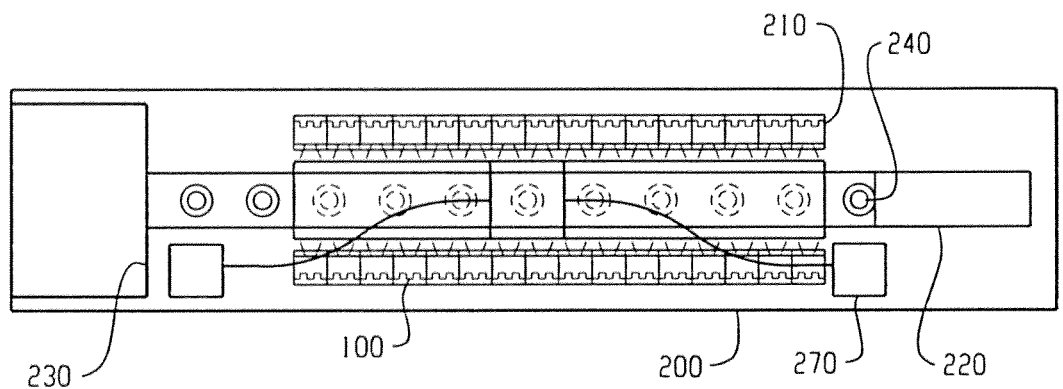
FIGS. 12a and 12b show the preferred deployment of RED heater elements within a blow molder.
Figure 12B:
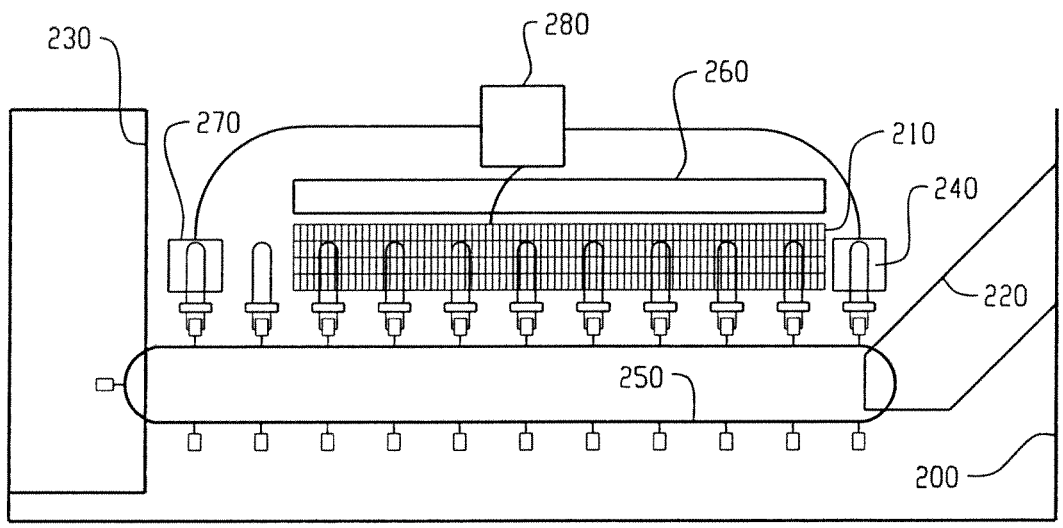

One deployment of the RED heater element 100, within a blow molder, is depicted in FIGS. 12a and 12b. In this system, preforms 240 enter into a thermal monitoring and conditioning system 210 via a transfer system 220. The preforms 240 could come into the thermal monitoring and control system 210 at room temperature, having been previously injection molded at some earlier time. Or, alternatively, the preforms 240 could come directly from an injection molding process as is done in single-stage injection molding/blow molding systems. Alternatively, the preforms could be made by one of several other processes. Whatever the form and timing of preform manufacturing, entering in this fashion, the preforms 240 would have varying amounts of latent heat contained within them.

Once presented by the transfer system 220, the preforms 240 are transported through the thermal monitoring and control system 210 via a conveyor 250, such conveyors being well known in industry. As the preforms 240 travel through the thermal monitoring and control system 210, they are subjected to radiant IR energy 170 emitted by a series of RED heater elements 100. The IR energy 170 emitted by these RED heater elements 100 is directly absorbed by the preforms 240 in preparation of entering the blowing system 230. It should be appreciated that the energy may be continuous or pulsed, as a function of the supply or drive current and/or other design objectives. The control system, such control system 280, in one form, controls this functionality. As an option, the control system is operative to pulse the system at electrical current levels that are substantially greater than recommended steady state current levels to achieve higher momentary emitted intensity in pulsed operation and respond to an input signal from an associated sensor capability to determine a timing of the pulsed operation In the preferred embodiment of a blow molder operating using the method and means described by this invention, a convection cooling system 260 is also preferably deployed. This system removes waste heat from the air and mechanics that are in proximity to the preforms 240 under process. A conduction cooling device may also be employed to do so. Heating of preforms by convection and/or conduction is known in the art to be deleterious to the overall thermal conditioning process. This is because PET is a very poor thermal conductor and heating the outer periphery of the preform results in uneven through heating, with too cool a center and a too warm outer skin.

Also contained within the preferred system embodiment are temperature sensors 270 (which may take the form of an intelligent sensor or camera that is capable of monitoring a target in at least one aspect beyond that which a single point temperature measurement sensor is capable) and a temperature control system 280. These aspects of the preferred blow molder design are particularly applicable to the attributes of a one-stage blow molding system. In a one-stage blow molding system, the preforms 240 enter into the thermal monitoring and conditioning system 210 containing latent heat energy obtained during the injection molding stage. By monitoring the temperature and thus the heat content of the incoming preforms 240 (or specific subsections of such performs), it is possible for a temperature monitoring and control system 280 to generate preform-specific (or subsection specific) heating requirements and then communicate these requirements in the form of drive signals to the individual RED heater elements 100. The solid-state nature and associated fast response times of RED emitters 10 make them particularly suited to allow the electrical supply current or on-time to be modulated as a function of time or preform movement. Also, subsections of the RED array may be controlled, as will be appreciated.

The temperature control system 280 used to enact such output control could be implemented as an industrial PC as custom embedded logic or as or an industrial programmable logic controller (PLC), the nature and operation all three are well known within industry. The control system, such as that shown as 280, may be configured a variety of ways to meet the objectives herein. However, as some examples, the system may control on/off status, electrical current flow and locations of activated devices for each wavelength in an RED array.

FIGS. 13-16 illustrate methods according to the present invention. It should be appreciated that these methods may be implemented using suitable software and hardware combinations and techniques. For example, the noted hardware elements may be controlled by a software routines stored and executed with the temperature control system 280.

Figure 13:
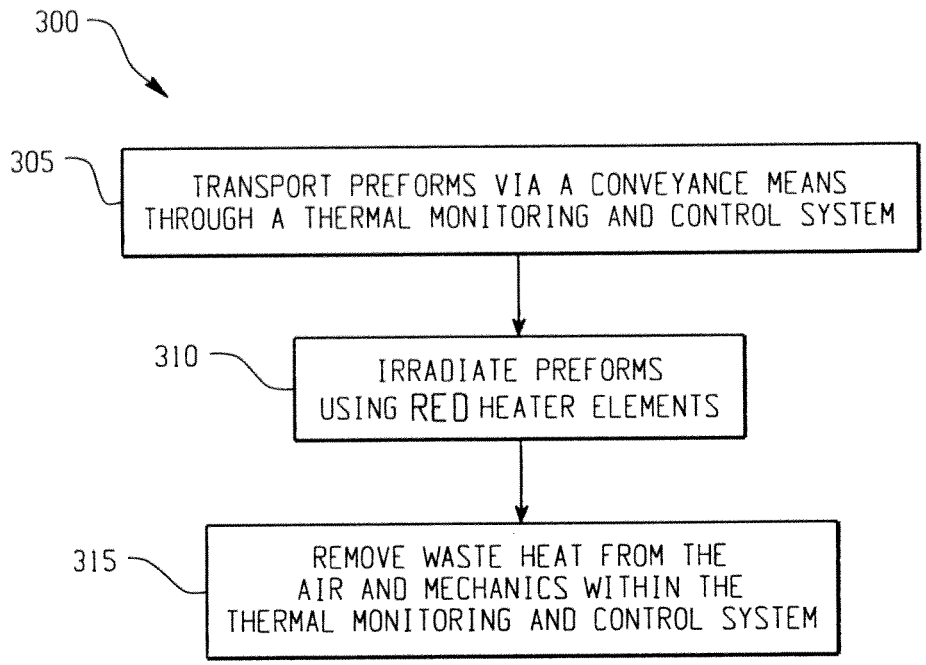
FIG. 13 shows a preferred method for the thermal treatment of preforms as described by this invention.

Referring now to FIG. 13, a preferred method 300 for the thermal treatment of thermoplastic preforms is shown outlining the basic steps of operation. Preforms 240 are transported via a conveyor 250 through a thermal monitoring and control system 210 (Step 305). Of course, it should be understood that, with all embodiments showing conveyance, a simple means to locate the articles for exposure, with or without conveyance, may be employed. The preforms 240 are irradiated using RED heater elements 100 contained within the thermal monitoring and control system 210 (Step 310). A convection cooling system 260 is used to remove waste heat from the air and mechanical components within the thermal monitoring and control system 210 (Step 315).

Figure 14:
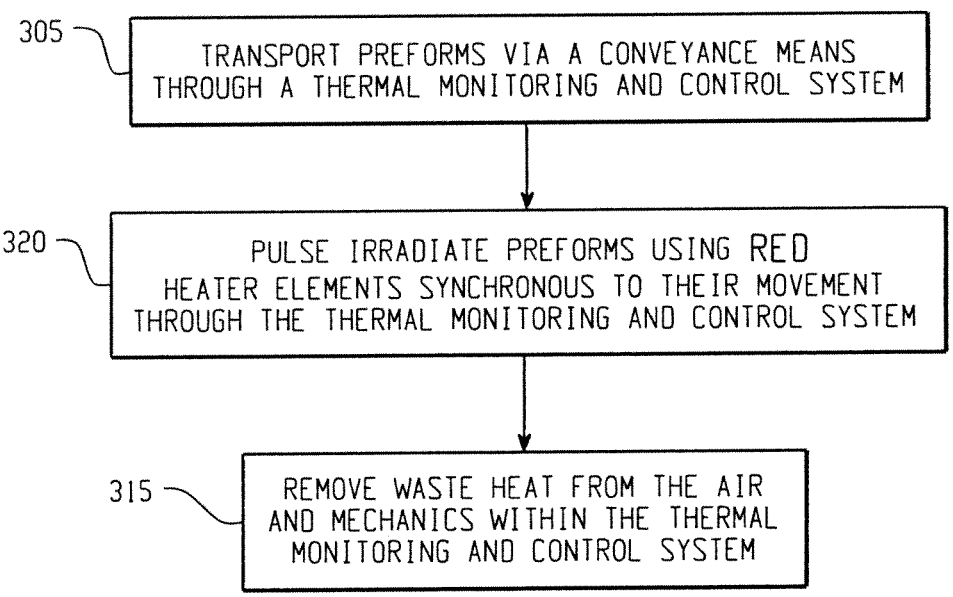
FIGS. 14-16 show alternate methods for the thermal treatment of thermoplastic preforms according to this invention.

Another method 301 for the treatment of thermoplastic preforms is outlined in FIG. 14. In method 301, (Step 310), the process of irradiating preforms 240 using RED heater elements 100, is replaced with Step 320. During Step 320 of method 301, preforms 240 are pulse irradiated synchronously to their motion through the thermal monitoring and conditioning system 210. This synchronous, pulse irradiation provides substantial additional energy efficiency because the RED devices nearest the perform are the only ones that are turned on at any given instant. In one form, the maximum output of the pulsed energy is synchronously timed to the transport of individual targets.

Figure 15:
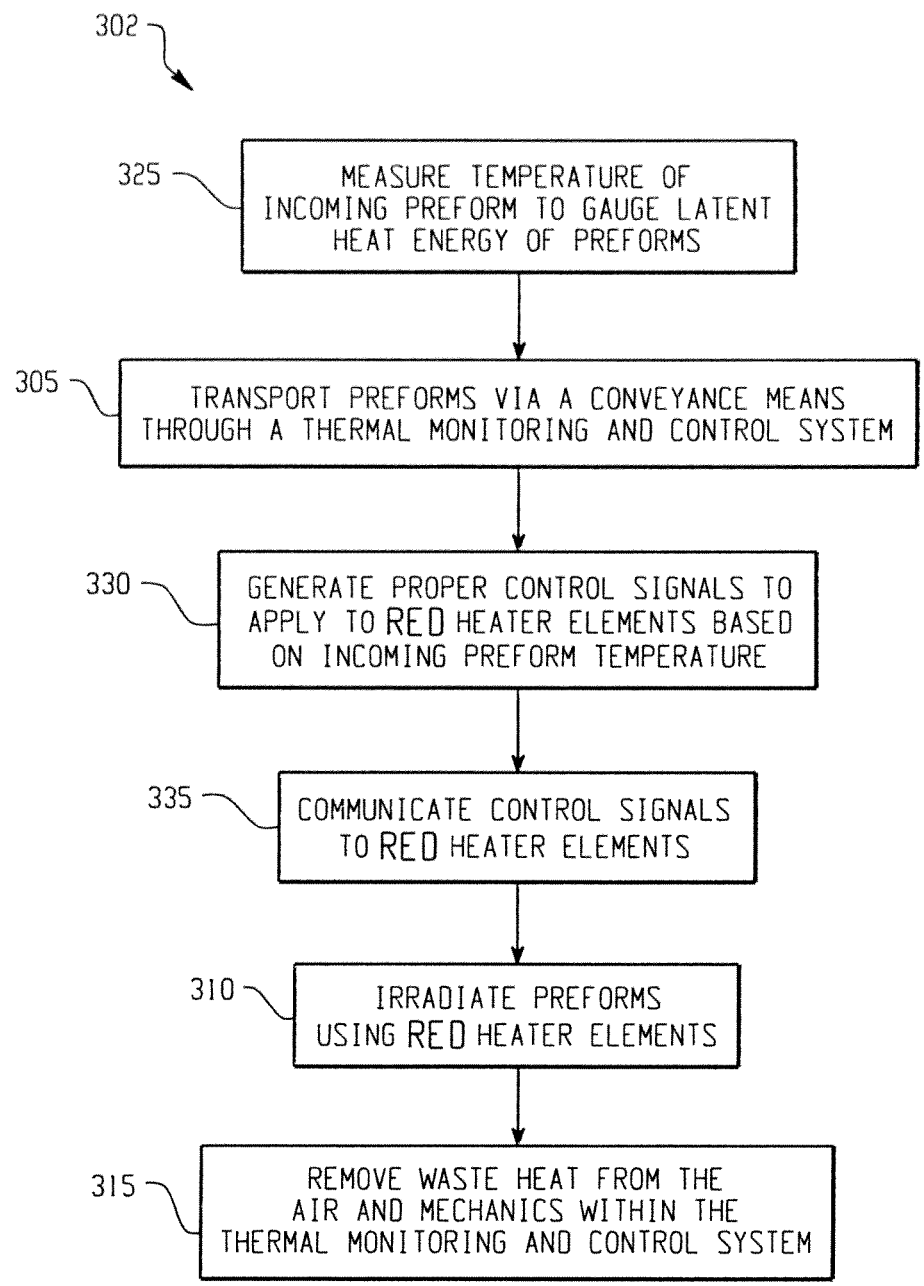

Yet another method 302 for the treatment of thermoplastic preforms is outlined in FIG. 15. In this method 302, the temperature of incoming preforms 240 is measured using temperature sensors 270. This is done to gauge the latent heat energy of preforms 240 as they enter into the system (Step 325). The preforms 240 are then transported via a conveyor 250 through a thermal monitoring and control system 210 (Step 305). A temperature control system 280 using the temperature information supplied by the temperature sensors 270 to generate a preferred control signal to be applied to the RED heater elements 100 (Step 330). The preferred control signal is then communicated from the temperature control system 280 to the RED heater elements 100 (Step 335). The preforms 240 are then irradiated using the RED heater elements 100 contained within the thermal monitoring and control systems 210 (Step 310). A convection cooling system 260 is then used to remove waste heat from the air and mechanical components within the thermal monitoring and control system 210 (Step 315).

Figure 16:
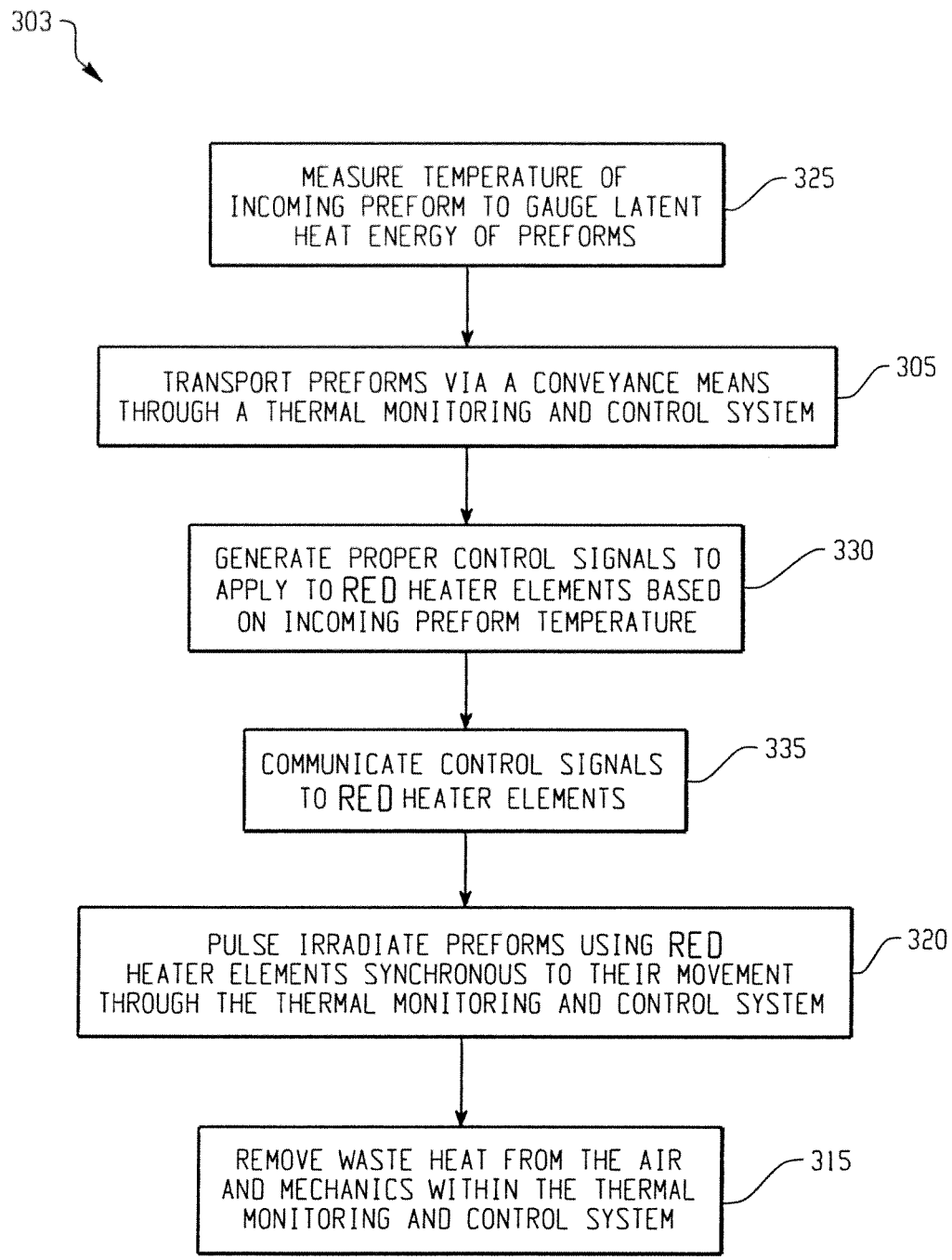

Still another method 303 of the treatment of thermoplastic preforms is outlined in FIG. 16. In method 303, Step 310, the process of irradiating preforms 240 using RED heating elements 100, is replaced with Step 320. During Step 320 of method 303, preforms 240 are pulse irradiated synchronously to their motion through the thermal monitoring and conditioning system 210.

The above description merely provides a disclosure of particular embodiments of the invention and is not intended for the purpose of limiting the same hereto. As such, the invention is not limited to only the above-described applications or embodiments. This disclosure addressed many applications of the invention broadly and one application embodiment specifically. It is recognized that one skilled in the art could conceive of alternative applications and specific embodiments that fall within the scope of the invention.

What is claimed is:

1. A system for non-contact thermal treatment of plastic target components prior to molding or processing operations comprising:
   a conveyor to locate plastic target components in a manner facilitating the application of radiant heating; and
   a thermal monitoring and control section into which the plastic components are located for exposure, the thermal monitoring and control section comprising one or more laser diodes operative to emit radiant energy in a narrow wavelength band matching a desired absorptive characteristic of the plastic target components via a direct electrical current-to-photon conversion process.

2. The system as set forth in claim 1 wherein the means operative to locate is a conveyance means operative to transport the plastic target components.

3. The system as set forth in claim 1 wherein the laser diodes are RED-based.

4. The system as set forth in claim 1 wherein the plastic components comprise preforms or bottles of plastic polymer material.

5. The system as set forth in claim 4 wherein the plastic polymer material is at least one of PET, PEN, or a thermoplastic material.

6. The system as set forth in claim 1 further comprising a convection cooling device.

7. The system as set forth in claim 1 further comprising a conduction cooling device.

8. The system as set forth in claim 1 further comprising a temperature sensor configured to measure temperature of individual target components entering the thermal monitoring and control section whereby latent heat content can be determined to generate control signals for applying laser diode emissions.

9. The system as set forth in claim 8 wherein the temperature sensor is an infrared camera.

10. The system as set forth in claim 1 wherein a temperature control system is used to generate control signals to apply to the laser diodes based on a target component temperature.

11. The system as set forth in claim 10 wherein the temperature of subsections of the target component are measured and is used to generate control signals to apply laser diode emissions to subsections of a target component.

12. The system as set forth in claim 1 wherein the at least one laser diode takes the form of an x by y array of individual laser RED devices.

13. The system as set forth in claim 1 wherein the at least one laser diode takes the form of a customized arrangement of individual laser RED devices.

14. The system of claim 12 wherein the arrays are in the form of chip on board x by y arrays of individual laser diodes.

15. The system of claim 1 further comprising a temperature sensor configured to measure temperature of incoming components to gauge latent heat content prior to entering the thermal monitoring and control section, generating control signals to apply to the laser diodes based on the incoming component temperatures and communicating control signals to the laser diodes.

16. The system as set forth in claim 1 wherein a wavelength of the radiant energy is selected to apply radiant heat of at least one wavelength selected based on absorption characteristics determined from a spectral absorption curve of the plastic target components.

17. The system as set forth in claim 16 wherein the laser diodes are operative to selectively supplied radiant heat at least two different wavelengths to facilitate a combination of heating characteristics.

18. A method of thermally treating thermoplastic preforms prior to stretch blow molding operations, the method comprising the steps of:
   transporting a series of preforms through a thermal monitoring and control section of a blow molding machine; and
   irradiating the preforms using a laser RED-based radiant heat source operative to emit radiant energy in a narrow wavelength band matching a desired absorptive characteristic of the preforms.

19. The method of claim 18 further comprising removing waste heat from air and mechanical components of the thermal monitoring and control section of the blow molding machine using a cooling system.

20. The method as set forth in claim 18 further comprising the steps of:
   measuring temperature of incoming preforms to gauge latent heat content prior to entering the thermal monitoring and control section;
   generating control signals to apply to the laser RED-based radiant heat source based on the incoming preform temperatures; and
   communicating these control signals to the laser RED-based radiant heat source.

21. The method as set forth in claim 18 further comprising measuring the temperature of subsections of a target component and generating control signals to apply the laser RED-based radiant heat source to the subsections.

22. A system for non-contact thermal treatment of plastic target components prior to molding or processing operations comprising:
   a means operative to locate plastic preform bottles in a manner facilitating the application of radiant heating; and
   a thermal monitoring and control section into which the plastic preform bottles are located for exposure, the thermal monitoring and control section comprising a laser-based radiant heat source operative to emit radiant energy in a narrow wavelength band matching a desired absorptive characteristic of the plastic target components.

23. The system of claim 22 wherein the laser-based radiant heat source is in the form of an x by y array of individual laser diodes.

24. A heat injection method applied to a target, the method comprising:
   locating the target for exposure to at least one radiation emitting device each radiation emitting device being operative to emit infrared energy in only a selected narrow infrared wavelength band;
   selectively supplying electrical current to the at least one radiation emitting device;
   selectively injecting heat in the selected narrow infrared wavelength band into the target by the at least one radiation emitting device based on the selected supplied electrical current, the selected narrow infrared wavelength band matching desired absorptive characteristics of the target, wherein the at least one radiation emitting device comprises an array of radiation emitting devices; and,
   measuring a temperature of the target and controlling the selective supplying of electrical current based on the temperature.

25. The method as set forth in claim 24 wherein the at least one radiation emitting device is operational in a pulse mode.

26. The method as set forth in claim 24 wherein the at least one radiation emitting device is in the form of an x by y array of individual devices.

27. The method as set forth in claim 26 wherein the array is a high density array.

28. The method as set forth in claim 26 wherein the array is a chip on board array.

29. The method as set forth in claim 26 wherein the array is configured based on electronic connectivity.

30. The system as set forth in claim 12 wherein the array is a high density array.

31. The system as set forth in claim 12 wherein the array is configured based on electronic connectivity.

32. The system as set forth in claim 23 wherein the arrays are high density arrays.

33. The system as set forth in claim 23 wherein the array is a chip on board array.

34. The system as set forth in claim 23 wherein the array is configured based on electronic connectivity.

35. A system for selectively injecting radiant heat into a target, the system comprising:
   at least one narrow wavelength band emitting element, the at least one narrow wavelength band element comprising an x by y, high density array of narrow wavelength band elements and being operative to emit infrared radiation in only a narrow infrared wavelength band of radiant heat output to match desired absorptive characteristics of the target;
   a mounting arrangement to position the array of narrow wavelength band elements such that infrared irradiation therefrom is directed at the target; and
   a current supply to the at least one narrow wavelength band element.

36. The system as set forth in claim 35 further comprising at least a second narrow wavelength band element operative to emit radiation in only a second narrow wavelength band.

37. The system as set forth in claim 36 further comprising at least a third narrow wavelength band element operative to emit radiation in only a third narrow wavelength band.

38. A system for non-contact thermal treatment of plastic target components prior to molding or processing operations comprising:
   a conveyor to locate plastic target components in a manner facilitating the application of radiant heating; and
   a thermal monitoring and control section into which the plastic components are located for exposure, the thermal monitoring and control section comprising one or more semiconductor-based narrow wavelength band radiant heating elements operative to emit radiant energy in only a narrow wavelength band matching a desired absorptive characteristic of the plastic target components via a direct electrical current-to-photon conversion process.

39. The system of claim 38 wherein the plastic target components comprise at least one of PET preforms or PET bottles.

40. A method of thermally treating thermoplastic preforms prior to stretch blowmolding operations, the method comprising the steps of:
   transporting a series of preforms through a thermal monitoring and control section of a blow molding machine;
   irradiating the preforms using narrow wavelength band radiant heating elements operative to emit radiant energy in only a narrow wavelength band matching a desired absorptive characteristic of the preforms; and
   removing waste heat from air and mechanical components of the thermal monitoring and control section of the blow molding machine using a cooling system.

41. The method of claim 40 wherein the thermoplastic preforms are PET preforms.

42. A system for use in a food oven, the system comprising:
   at least one array comprised of at least one semiconductor-based narrowband irradiation device operative to directly emit radiant energy in at least one narrow wavelength band matching at least one desired absorptive characteristic of at least one food item to irradiate the at least one food item; and a controller operative to control the at least one array to cause cooking or heating in the at least one food item.

43. The system as set forth in claim 42 wherein the controller is operative to control the at least one array to emit radiant energy in more than one narrow wavelength band.

44. The system as set forth in claim 43 wherein the more than one narrow wavelength band comprises a first wavelength band chosen for its more rapid absorption near a surface of the at least one food item and a second wavelength band chosen for deeper penetration than the first wavelength into the food item.

45. The system as set forth in claim 44 wherein the more than one narrow wavelength band comprises a third narrow wavelength band with a different absorption coefficient with at least some food items than the first and second wavelength bands.

46. The system as set forth in claim 42 wherein the controller is operative to control based on at least one of color, weight, moisture content, physical geometry, and temperature of the at least one food item.

47. The system as set forth in claim 46 wherein the controlling is operative to control based on feedback from sensors.

48. The system as set forth in claim 47 wherein the sensors comprise vision sensors.

49. The system as set forth in claim 47 wherein the sensors comprise moisture sensors.

50. The system as set forth in claim 42 wherein the controller is operative to selectively control at least a second cooking technology.

51. The system as set forth in claim 50 wherein the second cooking technology comprises one of convection cooking and microwave cooking.

52. The system as set forth in claim 42 wherein the controller is operative to control the at least one array to cause a desired processing effect in the at least one food item which comprises at least two food items on a mixed plate of food items.

53. The devices as set forth in claim 42 wherein the narrowband irradiation devices are semiconductor narrowband irradiation devices.

54. The array as set forth in claim 42 wherein the at least one array comprises multiple arrays.

55. The array as set forth in claim 42 wherein the at least one array is operative to output irradiation based on location and size of food items.

56. The system as set forth in claim 1 wherein the one or more laser diodes comprise an array of laser diodes.

57. The system as set forth in claim 22 wherein the laser-based radiant heat source comprises an array of laser diodes.

58. The system as set forth in claim 38 wherein the one or more semiconductor-based narrow wavelength band radiant heating elements comprises an array of semiconductor-based narrow wavelength band radiant heating elements.

59. The system as set forth in claim 42 wherein the at least one narrow wavelength band of radiant energy is infrared energy.

* * * * *